US010332993B2

(12) United States Patent
Mori

(10) Patent No.: US 10,332,993 B2
(45) Date of Patent: Jun. 25, 2019

(54) SEMICONDUCTOR DEVICE AND METHOD FOR MANUFACTURING THE SAME

(71) Applicant: Renesas Electronics Corporation, Tokyo (JP)

(72) Inventor: Kazuhisa Mori, Hitachinaka (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 15/912,099

(22) Filed: Mar. 5, 2018

(65) Prior Publication Data
US 2018/0331210 A1 Nov. 15, 2018

(30) Foreign Application Priority Data
May 9, 2017 (JP) ................. 2017-093094

(51) Int. Cl.
H01L 27/06 (2006.01)
H01L 27/07 (2006.01)
H01L 29/06 (2006.01)
H01L 29/10 (2006.01)
H01L 29/78 (2006.01)
H01L 23/495 (2006.01)
H01L 29/423 (2006.01)
H01L 21/8234 (2006.01)

(52) U.S. Cl.
CPC .. *H01L 29/7813* (2013.01); *H01L 21/823437* (2013.01); *H01L 21/823456* (2013.01); *H01L 23/4951* (2013.01); *H01L 23/49562* (2013.01); *H01L 23/49575* (2013.01); *H01L 27/0629* (2013.01); *H01L 27/0716* (2013.01); *H01L 29/0623* (2013.01); *H01L 29/1095* (2013.01); *H01L 29/4236* (2013.01); *H01L 29/4238* (2013.01)

(58) Field of Classification Search
CPC combination set(s) only.
See application file for complete search history.

(56) References Cited

U.S. PATENT DOCUMENTS

2012/0007169 A1* 1/2012 Hikida ................ H01L 27/0921
257/328
2015/0287712 A1* 10/2015 Kitajima .............. H02H 11/002
361/56

FOREIGN PATENT DOCUMENTS

JP 2013-038908 A 2/2013

* cited by examiner

Primary Examiner — Jasmine J Clark
(74) Attorney, Agent, or Firm — McGinn IP Law Group, PLLC.

(57) ABSTRACT

A semiconductor device with a simplified structure including an energization control element and reverse coupling protection element, and a manufacturing method therefor. Its semiconductor substrate has deep and shallow trenches in its first surface. A first n-type impurity region lies in its second surface in contact with the deep trench bottom. A p-type impurity region includes: a p-type base region to make a pn junction with the first n-type region and in contact with the shallow trench bottom; and a back gate region joined to the p-type base region, lying in the first surface. A second n-type impurity region makes a pn junction with the p-type impurity region, lying in the first surface in contact with the shallow trench side face. An n$^+$ source region makes a pn junction with the p-type region, lying in the first surface in contact with the side faces of deep and shallow trenches.

16 Claims, 27 Drawing Sheets

SEMICONDUCTOR DEVICE AND METHOD FOR MANUFACTURING THE SAME

CROSS-REFERENCE TO RELATED APPLICATIONS

The disclosure of Japanese Patent Application No. 2017-093094 filed on May 9, 2017 including the specification, drawings and abstract is incorporated herein by reference in its entirety.

BACKGROUND

The present invention relates to a semiconductor device and a method for manufacturing the same.

In order to control a large current flowing in a load, a semiconductor power device such as a power MOSFET (Metal Oxide Semiconductor Field Effect Transistor) is used. If there is reverse coupling of power supply in the use of such a semiconductor power device, the parasitic diode formed between the source and drain of the power MOSFET is forward-biased. As a result, unintendedly the load might be continuously energized, resulting in destruction of the load or thermal destruction of the power MOSFET. One technique to prevent continuous energization of the load is that a diode or the like is series-coupled between the semiconductor power device and the power supply.

For example, Japanese Unexamined Patent Application Publication No. 2013-38908 discloses a technique that a semiconductor element for protection against power supply reverse coupling is provided on the upstream (power supply side) of a semiconductor element for energization control in order to achieve protection against battery reverse coupling.

SUMMARY

However, if the semiconductor element for energization control and the semiconductor element for protection against power supply reverse coupling are provided on different chips, a larger number of components and a higher cost are required, resulting in an increase in percent defective.

On the other hand, if the semiconductor element for energization control and the semiconductor element for protection against power supply reverse coupling are mounted on one chip, the structure may be complicated.

The above and further objects and novel features of the invention will more fully appear from the following detailed description in this specification and the accompanying drawings.

According to one aspect of the present invention, there is provided a semiconductor device which has an energization control element including a first field effect transistor and a first diode and a reverse coupling protection element including a second field effect transistor and a second diode. The semiconductor substrate has a deep trench and a shallow trench shallower than the deep trench in its first surface. A first region of first conductivity type lies in the second surface and is in contact with the bottom face of the deep trench. A second region of second conductivity type has a first portion located on the first surface side of the first region to make a pn junction with the first region and in contact with the bottom face of the shallow trench, and a second portion joined to the first portion and located in the first surface. A third region of the first conductivity type is located in the first surface in a manner to make a pn junction with the second region and be in contact with the side face of the shallow trench. A fourth region of the first conductivity type is located in the first surface in a manner to sandwich the shallow trench with the third region, make a pn junction with the second region, and be in contact with the side face of the deep trench and the side face of the shallow trench. A first gate electrode is located in the deep trench in a manner to face the second region in an insulated manner and included in the first field effect transistor. A second gate electrode is located in the shallow trench in a manner to face the second region in an insulated manner and included in the second field effect transistor.

According to the present invention, there are provided a semiconductor device with a simplified structure including an energization control element and a reverse coupling protection element, and a method for manufacturing the same.

BRIEF DESCRIPTION OF THE DRAWINGS

FIGS. 18A and 18B are schematic sectional views which show the tenth step of the method for manufacturing the semiconductor device according to the first embodiment, in which FIG. 18A shows implantation of n-type impurity ions and FIG. 18B shows implantation of p-type impurity ions;

DETAILED DESCRIPTION

Next, preferred embodiments of the invention will be described referring to drawings.

First Embodiment

First, the structure of the semiconductor device according to a first embodiment will be described referring to FIGS. 1 to 8.

Figure 1:
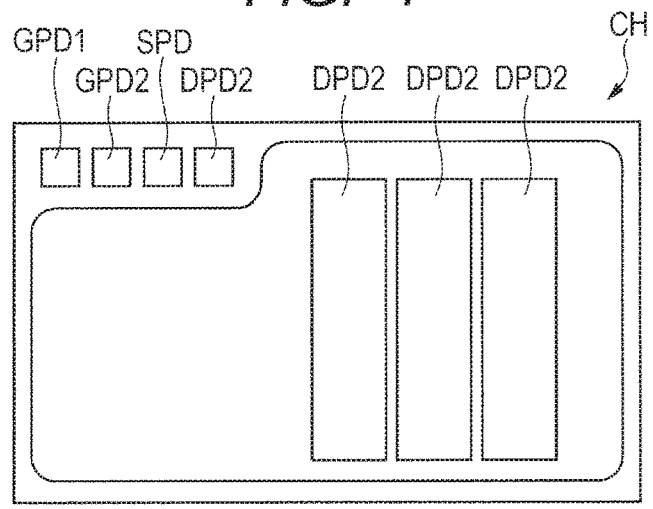
FIG. 1 is a plan view which schematically shows the structure of a semiconductor device in the form of a chip according to a first embodiment of the invention.

As shown in FIG. 1, a semiconductor device CH according to this embodiment is in the form of a chip. A first gate pad electrode GPD1, second gate pad electrode GPD2, source pad electrode SPD, and second drain pad electrode DPD2 are provided on one surface of the semiconductor device CH. Also, a first drain pad electrode is provided on the other surface of the semiconductor device CH, though not shown.

Figure 2:
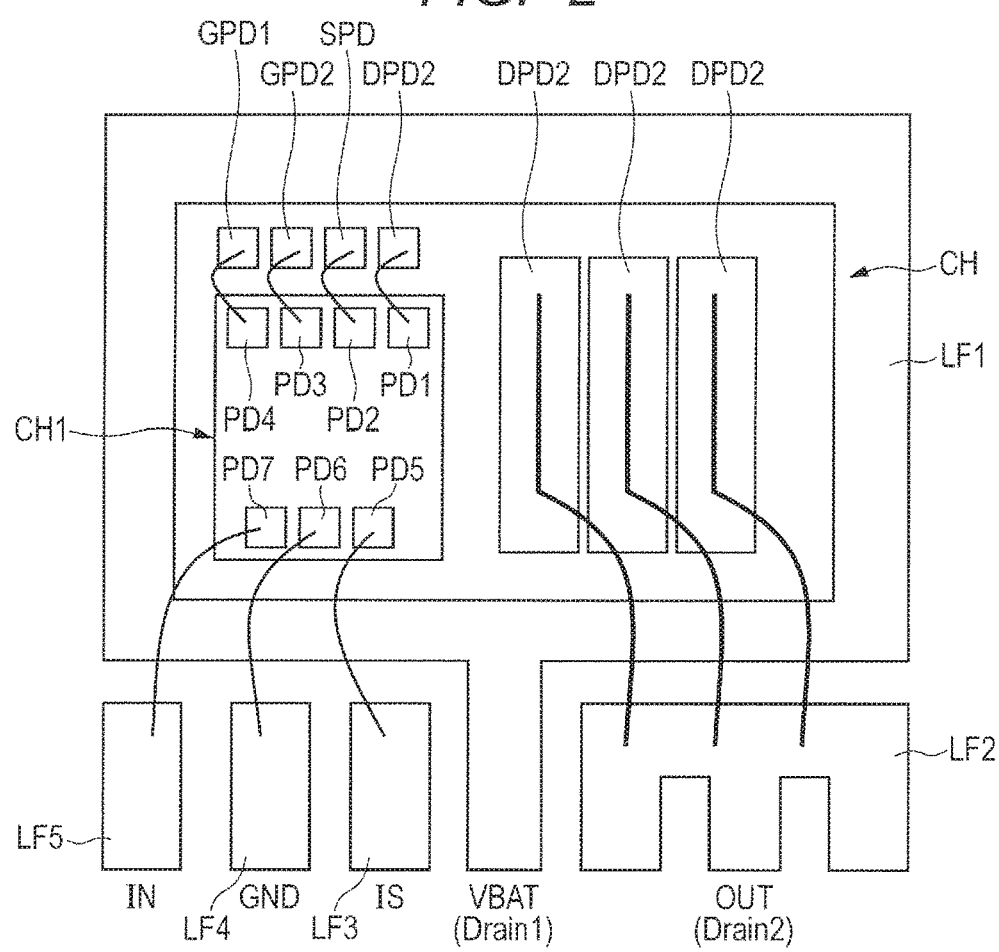
FIG. 2 is a plan view which shows the semiconductor device, in the form of a chip as shown in FIG. 1, mounted on a lead frame.

The semiconductor device CH shown in FIG. 1 is placed over a lead frame LF1 as shown in FIG. 2. The first drain pad electrode on the other surface of the semiconductor device CH is electrically coupled to the lead frame LF1. The second drain pad electrodes DPD2 of the semiconductor device CH are electrically coupled to a lead frame LF2 through bonding wires or the like.

Another semiconductor device CH1 is mounted on the one surface of the semiconductor device CH. The other semiconductor device CH1 is also in the form of a chip. The pad electrode PD1 of the other semiconductor device CH1 is electrically coupled to the second drain pad electrode DPD2 of the semiconductor device CH through a bonding wire or the like. The pad electrode PD2 of the other semiconductor device CH1 is electrically coupled to the source pad electrode SPD of the semiconductor device CH through a bonding wire or the like.

The pad electrode PD3 of the other semiconductor device CH1 is electrically coupled to the second gate pad electrode GPD2 of the semiconductor device CH through a bonding wire or the like. The pad electrode PD4 of the other semiconductor device CH1 is electrically coupled to the first gate pad electrode GPD1 of the semiconductor device CH through a bonding wire or the like.

The pad electrodes PD5, PD6, and PD7 of the other semiconductor device CH1 are electrically coupled to lead frames LF3, LF4, and LF5 through bonding wires or the like, respectively.

The semiconductor device CH according to this embodiment is not limited to a semiconductor chip. Instead, it may be a resin-sealed semiconductor package. Furthermore, the semiconductor device according to this embodiment may be a semiconductor module including a semiconductor chip or semiconductor package.

Figure 3:
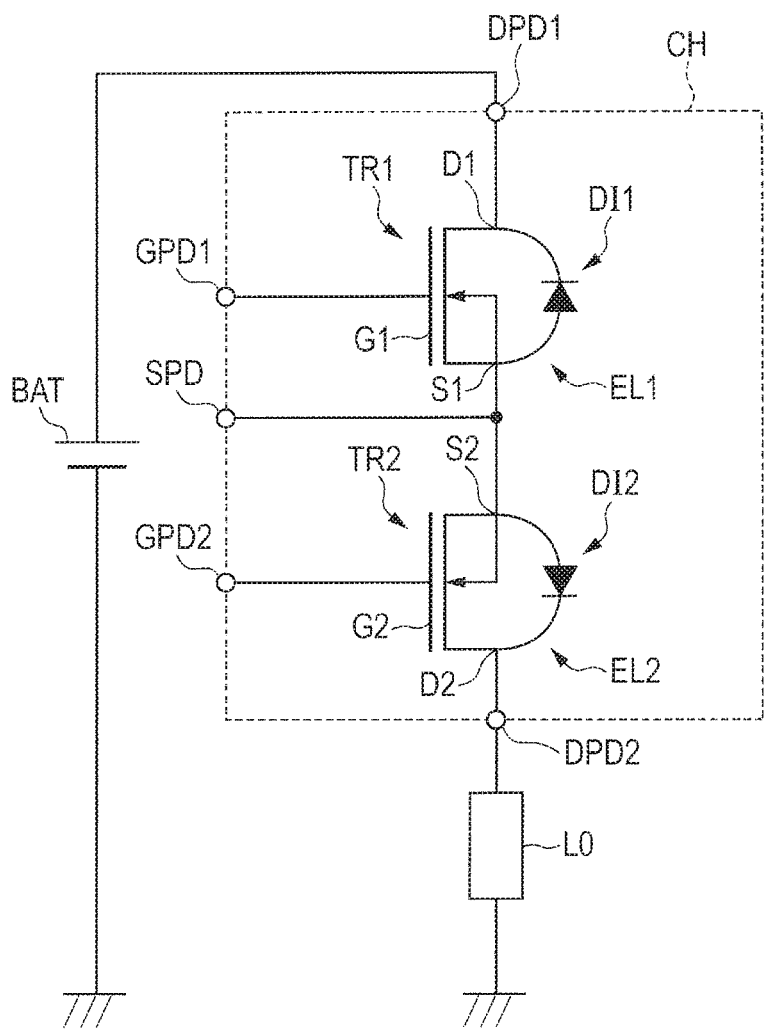
FIG. 3 is a circuit diagram which shows the circuit configuration of the semiconductor device according to the first embodiment.

As shown in FIG. 3, the semiconductor device CH according to this embodiment is electrically coupled between a power supply BAT such as a battery, and a load LO. The semiconductor device CH is electrically coupled, for example, to the positive electrode of the power supply BAT.

The semiconductor device CH has an energization control element EL1 and a reverse coupling protection element EL2. The energization control element EL1 is located nearer to the power supply BAT than the reverse coupling protection element EL2.

The energization control element EL1 has an n-channel MOS transistor (hereinafter called nMOS transistor) TR1 (first field effect transistor) and a first parasitic diode DI1 (first diode). The drain D1 of the nMOS transistor TR1 is electrically coupled to the cathode of the first parasitic diode DI1. The source S1 of the nMOS transistor TR1 is electrically coupled to the anode of the first parasitic diode DI1.

The reverse coupling protection element EL2 has an nMOS transistor TR2 (second field effect transistor) and a second parasitic diode DI2 (second diode). The drain D2 of the nMOS transistor TR2 is electrically coupled to the cathode of the second parasitic diode DI2. The source S2 of the nMOS transistor TR2 is electrically coupled to the anode of the second parasitic diode DI2.

The source S1 of the nMOS transistor TR1 and the source S2 of the nMOS transistor TR2 are electrically coupled to each other. A source pad electrode SPD is electrically coupled to each of the sources S1 and S2. A potential is given from outside the semiconductor device CH to each of the sources S1 and S2 through the source pad electrode SPD.

The first gate pad electrode GPD1 is electrically coupled to the gate G1 of the nMOS transistor TR1. A signal can be sent from outside the semiconductor device CH to the gate G1 through the first gate pad electrode GPD1.

The second gate pad electrode GPD2 is electrically coupled to the gate G2 of the nMOS transistor TR2. A signal can be sent from outside the semiconductor device CH to the gate G2 through the second gate pad electrode GPD2.

The first drain pad electrode DPD1 is electrically coupled to the drain D1 of the nMOS transistor TR1. A voltage can be applied from outside the semiconductor device CH to the drain D1 of the nMOS transistor TR1 through the first drain pad electrode DPD1. The first drain pad electrode DPD1 is the part to be electrically coupled to the power supply BAT.

The second drain pad electrode DPD2 is electrically coupled to the drain D2 of the nMOS transistor TR2. A voltage can be outputted from the drain D2 of the nMOS transistor TR2 to outside the semiconductor device CH through the second drain pad electrode DPD2. The second drain pad electrode DPD2 is the part to be electrically coupled to the load LO.

Figure 4:
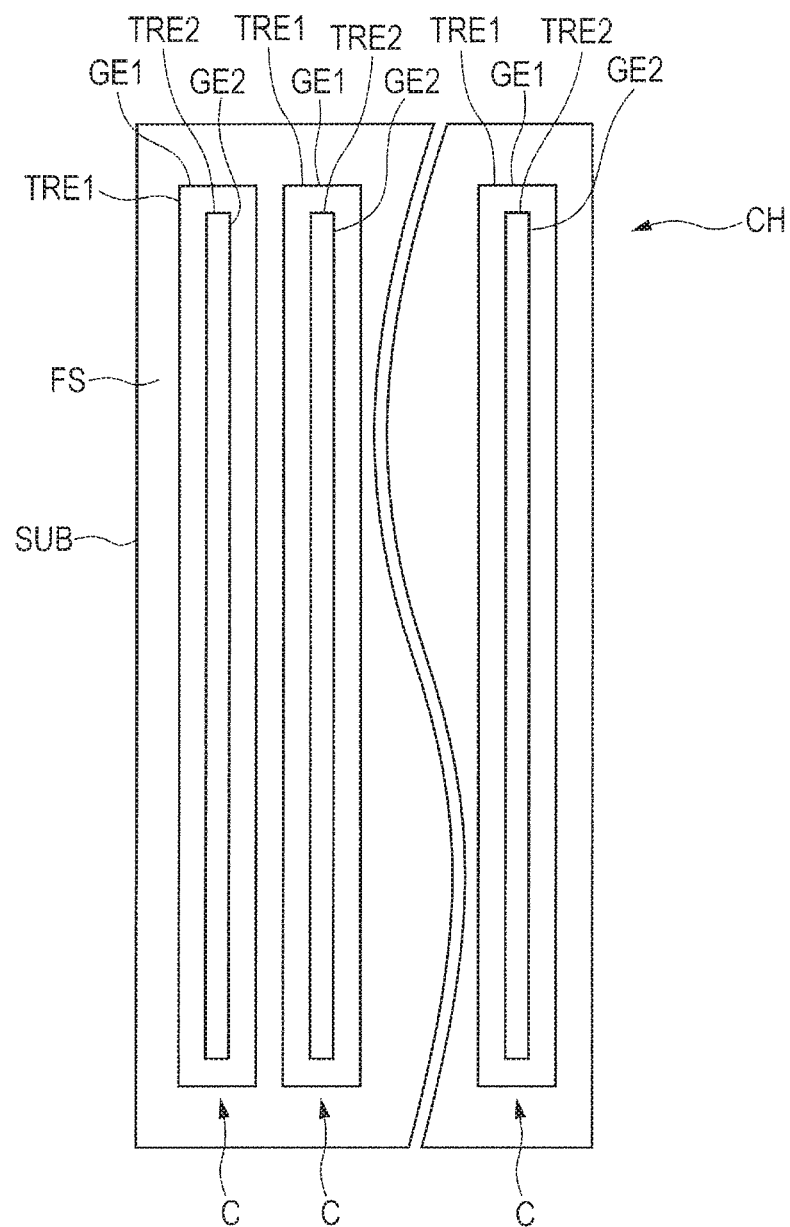
FIG. 4 is a plan view which shows the arrangement of trenches for gate electrodes in the first surface of the semiconductor device according to the first embodiment.

As shown in FIG. 4, a plurality of unit cells C are arranged in the semiconductor device CH according to this embodiment. Each of the unit cells C includes a gate electrode GE1 of an nMOS transistor TR1 and a gate electrode GE2 of an nMOS transistor TR2 which are formed in the first surface FS of the semiconductor substrate SUB. The gate electrode GE1 is buried in a deep trench TRE1 made in the first surface FS. The gate electrode GE2 is buried in a shallow trench TRE2 made in the first surface FS.

In the plan view of FIG. 4, the gate electrodes GE1 and GE2 are shaped like a frame. In each of the unit cells C, the gate electrode GE1 is located in a manner to surround the gate electrode GE2 in plan view. A plurality of such unit cells C are provided. The unit cells C are aligned in a straight line. The deep trenches TRE1 of cells C adjacent to each other in plan view among the unit cells C are separated from each other.

In this specification, "plan view" means a view taken from the direction perpendicular to the first surface FS.

Figure 5:
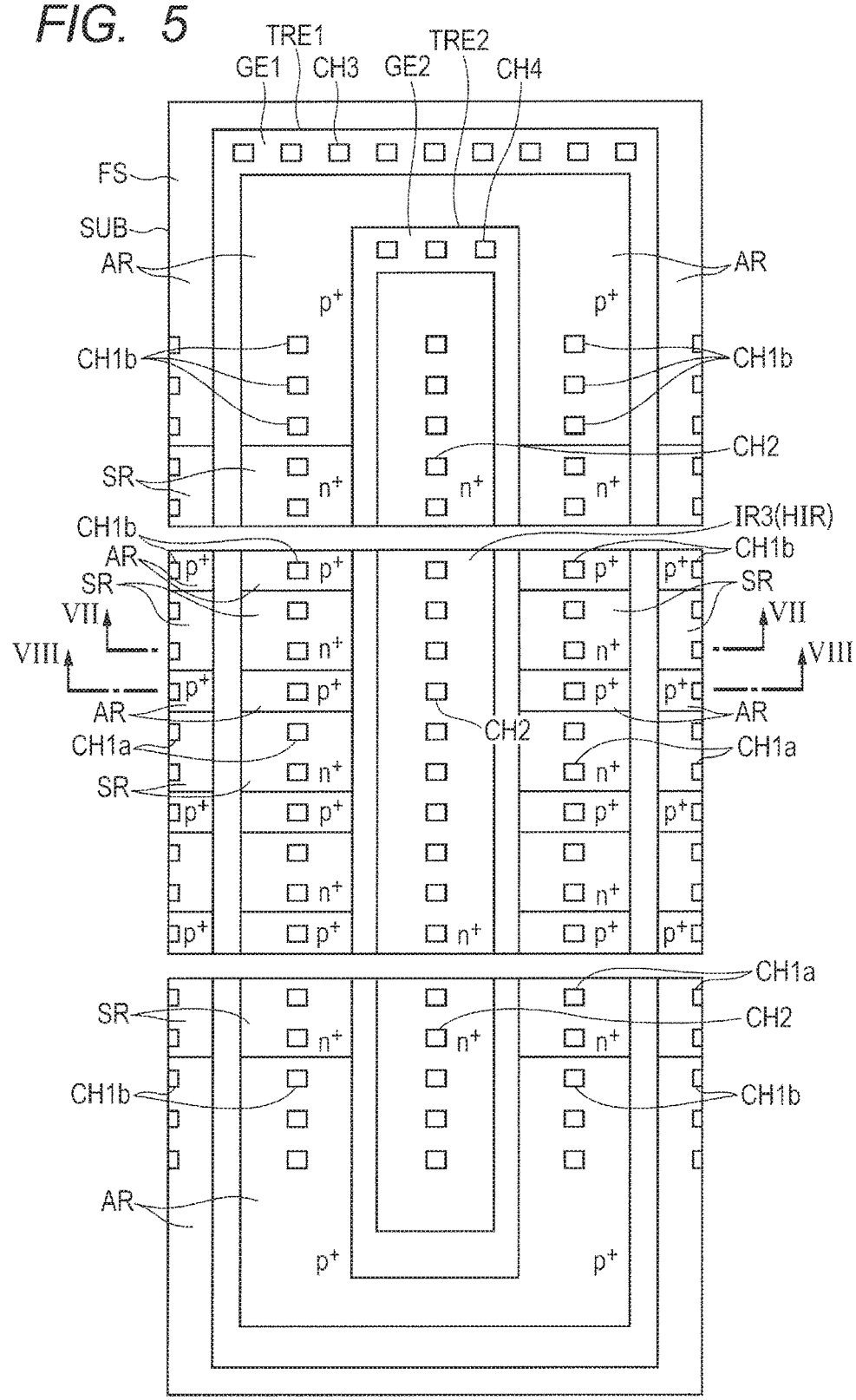
FIG. 5 is an enlarged plan view which shows part of what is shown in FIG. 4 in enlarged form.

As shown in FIG. 5, an n-type impurity region IR3 (third region) is formed in the first surface FS's area surrounded by the gate electrode GE2 in plan view. An n$^+$ source region SR (fourth region) and a p$^+$ back gate region AR (second portion of the second region) are formed in the area between the gate electrode GE1 and gate electrode GE2 in plan view.

In plan view, a plurality of n$^+$ source regions SR and a plurality of p$^+$ back gate regions AR are alternately arranged along the longitudinal direction of the gate electrodes GE1 and GE2. The n$^+$ source regions SR and p$^+$ back gate regions AR are each in contact with both the side face of the deep trench TRE1 and the side face of the shallow trench TRE2.

In an area between the gate electrodes GE1 and GE2 in plan view, p$^+$ back gate regions AR are located at both ends of the gate electrodes GE1 and GE2 in the longitudinal direction. In plan view, p$^+$ back gate regions AR are located in an area which extends in the short side direction of the gate electrode GE1.

Figure 6:
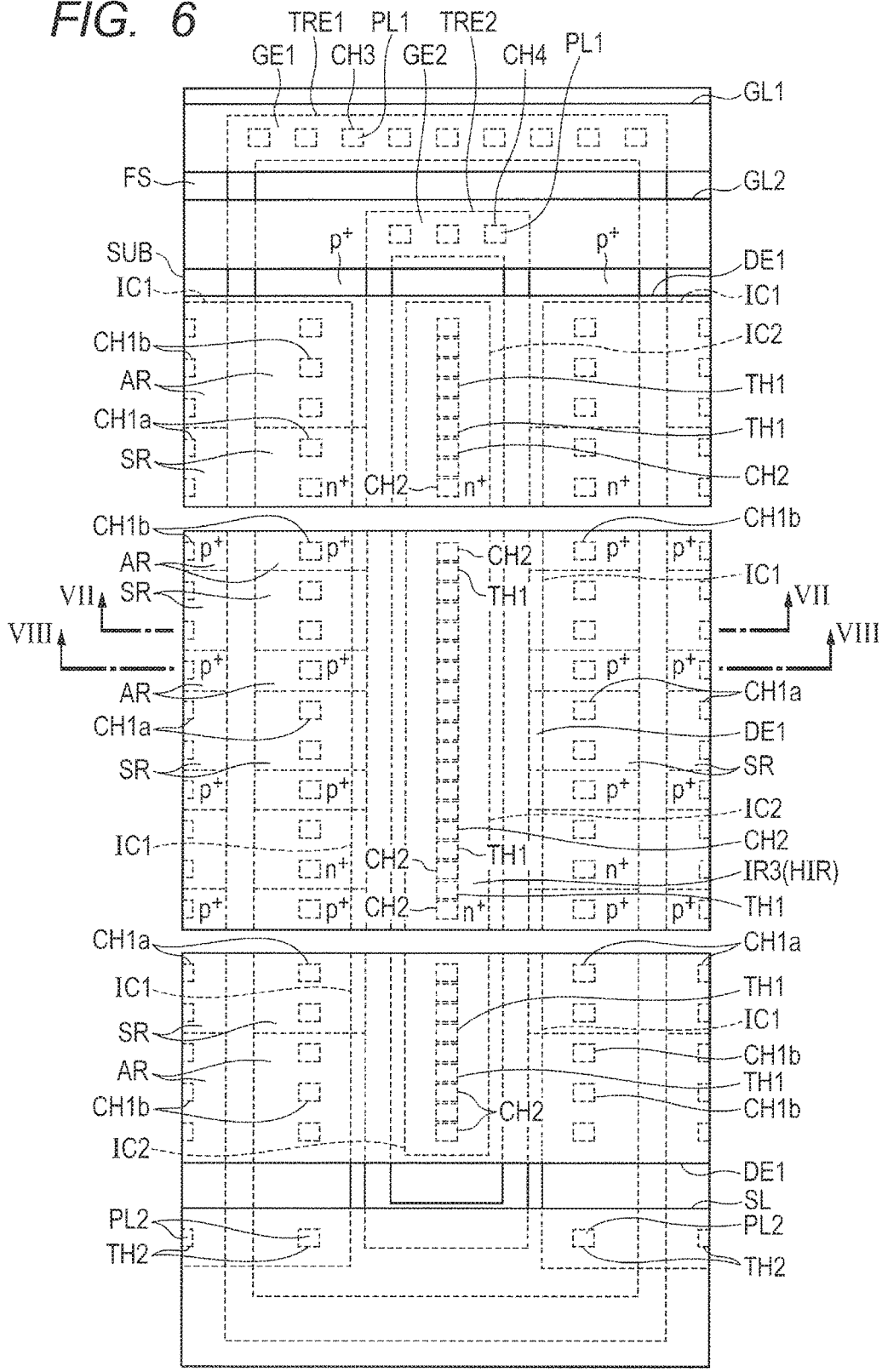
FIG. 6 is an enlarged plan view which shows wiring layers lying over what is shown in FIG. 5.

As shown in FIG. 6, first-layer wiring layers IC1, IC2, GL1, and GL2 lie over the first surface FS of the semiconductor substrate SUB. Second-layer wiring layers DE1 and SL lie over the first-layer wiring layers IC1, IC2, GL1, and GL2.

The first-layer wiring layer IC1 is electrically coupled to an n$^+$ source region SR through a contact hole CH1$a$. Also, the first-layer wiring layer IC1 is electrically coupled to a p$^+$ back gate region AR through a contact hole CH1$b$. Consequently, the n$^+$ source region SR and p$^+$ back gate region AR are electrically coupled to each other through the wiring layer IC1.

The first-layer wiring layer IC2 is electrically coupled to an n-type impurity region IR3 through a contact hole CH2. The first-layer wiring layer GL1 is electrically coupled to the gate electrode GE1 through a contact hole CH3. The first-layer wiring layer GL2 is electrically coupled to the gate electrode GE2 through a contact hole CH4.

The second-layer wiring layer DE1 is electrically coupled to the first-layer wiring layer IC2 through a through hole TH1. The second-layer wiring layer SL is electrically coupled to the first-layer wiring layer IC1 through a through hole TH2.

Figure 7:
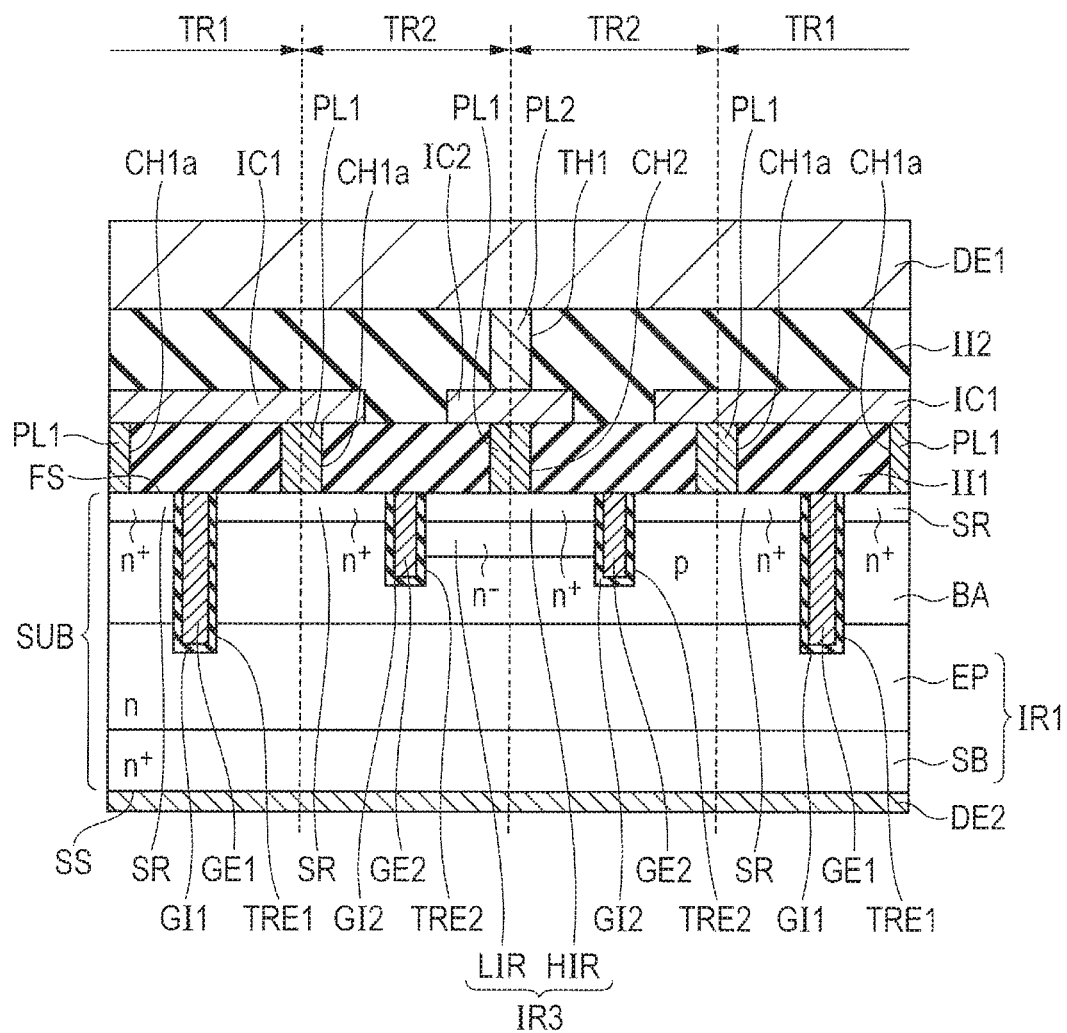
FIG. 7 is a schematic sectional view taken along the line VII-VII of FIGS. 5 and 6.
Figure 8:
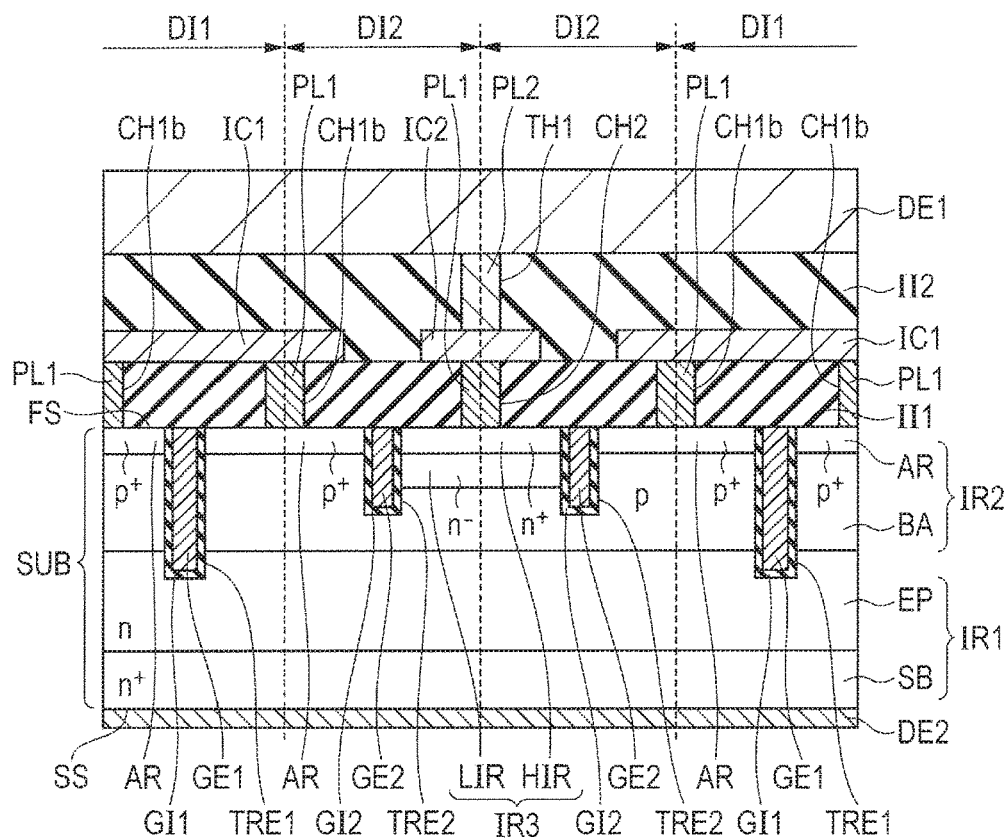
FIG. 8 is a schematic sectional view taken along the line VIII-VIII of FIGS. 5 and 6.

As shown in FIGS. 7 and 8, the semiconductor substrate SUB has a first surface FS and a second surface SS which are opposite to each other. The semiconductor substrate SUB has a deep trench TRE1 and a shallow trench TRE2. The deep trench TRE1 and shallow trench TRE2 are made in the first surface FS of the semiconductor substrate SUB. The depth of the shallow trench TRE2 is shallower than the depth of the deep trench TRE1.

The n-type impurity region IR1 (first region) lies in the second surface SS of the semiconductor substrate SUB. The n-type impurity region IR1 is in contact with the bottom face of the deep trench TRE1. The n-type impurity region IR1 includes an n$^+$ substrate region SB and an n-type epitaxial region EP.

The n$^+$ substrate region SB lies on the second surface SS. The n-type epitaxial region EP is located on the first surface FS side of the n$^+$ substrate region SB and joined to the n$^+$ substrate region SB. The n-type epitaxial region EP is in contact with the bottom face of the deep trench TRE1. Then-type epitaxial region EP has a lower n-type impurity concentration than the n$^+$ substrate region SB.

As shown in FIG. 8, a p-type impurity region IR2 (second region) is located on the first surface FS side of the n-type impurity region IR1. The p-type impurity region IR2 makes a pn junction with the n-type impurity region IR1. The p-type impurity region IR2 includes a p-type base region BA (first portion) and a back gate region AR (second portion).

The p-type base region BA is located on the first surface FS side of the n-type impurity region IR1 and makes a pn junction with the n-type impurity region IR1. The p-type base region BA lies in the area between the deep trench TRE1 and shallow trench TRE2 and in the frame-like area surrounded by the shallow trench TRE2 in plan view. The p-type base region BA is in contact with the bottom face of the shallow trench TRE2. The p-type base region BA is in contact with both the side face of the deep trench TRE1 and the side face of the shallow trench TRE2. The p-type base region BA has a shallower depth than the deep trench TRE1 with respect to the first surface FS.

The back gate region AR is joined to the p-type base region BA and located in the first surface FS. The back gate region AR has a higher p-type impurity concentration than the p-type base region BA. The back gate region AR lies in the area between the deep trench TRE1 and shallow trench TRE2. The back gate region AR is in contact with both the side face of the deep trench TRE1 and the side face of the shallow trench TRE2 in the first surface FS.

As shown in FIGS. 7 and 8, an n-type impurity region IR3 (third region) is located in a manner to make a pn junction with the p-type impurity region IR2. The n-type impurity region IR3 is formed in the frame-like area surrounded by the shallow trench TRE2 in plan view in the first surface FS. The n-type impurity region IR3 is in contact with the side faces of both a pair of portions of the shallow trench TRE2 which sandwich the n-type impurity region IR3. The n-type impurity region IR3 has a shallower depth than the shallow trench TRE2 with respect to the first surface FS.

The n-type impurity region IR3 includes an n$^-$ region LIR and an n$^+$ region HIR. The n$^+$ region HIR has a higher n-type impurity concentration than the n$^-$ region LIR. The n$^-$ region LIR is located on the first surface FS side of the p-type base region BA and makes a pn junction with the p-type base region BA. The n$^+$ region HIR is joined to the n$^-$ region LIR and located in the first surface FS. The n$^-$ region LIR and n$^+$ region HIR are each in contact with the side faces of both a pair of portions of the shallow trench TRE2 which sandwich the n-type impurity region IR3.

As shown in FIG. 7, the n$^+$ source region SR (fourth region) is located so as to make a pn junction with the p-type base region BA. The n$^+$ source region SR is located between the deep trench TRE1 and shallow trench TRE2 in the first surface FS. The n$^+$ source region SR is in contact with both the side face of the deep trench TRE1 and the side face of the shallow trench TRE2.

As shown in FIGS. 7 and 8, a gate insulating layer GI1 lies on the wall face (side face and bottom face) of the deep trench TRE1. The gate insulating layer GI1 is, for example, a silicon oxide film. A gate electrode GE1 is buried in the deep trench TRE1. The gate electrode GE1 is, for example, made of polycrystalline silicon doped with impurities (hereinafter called doped polysilicon). The gate electrode GE1 faces part of the p-type base region BA through the gate insulating film GI1 in an insulated manner.

A gate insulating layer GI2 lies on the wall face (side face and bottom face) of the shallow trench TRE2. The gate insulating layer GI2 is, for example, a silicon oxide film. A gate electrode GE2 is buried in the shallow trench TRE2. The gate electrode GE2 is, for example, made of doped polysilicon. The gate electrode GE2 faces part of the p-type base region BA through the gate insulating film GI2 in an insulated manner.

As shown in FIG. 7, the n-type impurity region IR1 functions as a drain of the nMOS transistor TR1 (FIG. 3) which configures the energization control element EL1. The n$^+$ source region SR functions as a source of the nMOS transistor TR1. The p-type base region BA is a region where the channel of the nMOS transistor TR1 is formed. The gate electrode GE1 functions as a gate of the nMOS transistor TR1. The nMOS transistor TR1 is a so-called vertical transistor.

As shown in FIG. 8, the n-type impurity region IR1 functions as a cathode of the first parasitic diode DI1 (FIG. 3) which configures the energization control element EL1. The p-type impurity region IR2 functions as an anode of the first parasitic diode DI1.

As shown in FIG. 7, the n-type impurity region IR3 functions as a drain of the nMOS transistor TR2 (FIG. 3) which configures the reverse coupling protection element EL2. The n$^+$ source region SR functions as a source of the nMOS transistor TR2. The p-type base region BA is a region where the channel of the nMOS transistor TR2 is formed. The gate electrode GE2 functions as a gate of the nMOS transistor TR2. The nMOS transistor TR2 is a so-called horizontal transistor.

As shown in FIG. 8, the n-type impurity region IR3 functions as a cathode of the second parasitic diode DI2 (FIG. 3) which configures the reverse coupling protection element EL2. The p-type impurity region IR2 functions as an anode of the second parasitic diode DI2.

As shown in FIGS. 7 and 8, an interlayer insulating layer II1 lies over the first surface FS of the semiconductor substrate SUB. The interlayer insulating film II1 covers the first surface FS of the semiconductor substrate SUB. Contact holes CH1$a$, CH1$b$, CH2, CH3 (FIG. 5), and CH4 (FIG. 5) are made in the interlayer insulating film II1.

As shown in FIG. 7, the contact hole CH1$a$ reaches from the upper surface of the interlayer insulating film II1 to the n$^+$ source region SR. As shown in FIG. 8, the contact hole CH1$b$ reaches from the upper surface of the interlayer insulating film II1 to the p$^+$ back gate region AR. As shown in FIGS. 7 and 8, the contact hole CH2 reaches from the upper surface of the interlayer insulating layer II1 to the n$^+$ region HIR.

As shown in FIG. 5, the contact hole CH3 reaches from the upper surface of the interlayer insulating film II1 to the gate electrode GE1. The contact hole CH4 reaches from the upper surface of the interlayer insulating film II1 to the gate electrode GE2.

As shown in FIGS. 7 and 8, wiring layers IC1, IC2, GL1 (FIG. 6), and GL2 (FIG. 6) lie over the interlayer insulating layer II1. The wiring layer IC1 is electrically coupled to the n$^+$ source region SR through a plug conductive layer PL1 buried in the contact hole CH1$a$. Also, the wiring layer IC1 is electrically coupled to the p$^+$ back gate region AR through a plug conductive layer PL1 buried in the contact hole CH1$b$. The wiring layer IC2 is electrically coupled to the n$^+$ region HIR through a plug conductive layer PL1 buried in the contact hole CH2.

As shown in FIG. 6, the wiring layer GL1 is electrically coupled to the gate electrode GE1 through a plug conductive layer PL1 buried in the contact hole CH3. The wiring layer GL2 is electrically coupled to the gate electrode GE2 through a plug conductive layer PL1 buried in the contact hole CH4.

As shown in FIGS. 7 and 8, an interlayer insulating layer II2 lies over the interlayer insulating layer II1. The interlayer insulating layer II2 covers the interlayer insulating layer II1 and wiring layers IC1, IC2, GL1, and GL2. Through holes TH1 and TH2 (FIG. 6) are made in the interlayer insulating layer II2.

The through hole TH1 reaches from the upper surface of the interlayer insulating layer II2 to the wiring layer IC2. As shown in FIG. 6, the through hole TH2 reaches from the upper surface of the interlayer insulating layer II2 to the wiring layer IC1.

As shown in FIGS. 7 and 8, wiring layers DE1 and SL (FIG. 6) lie over the interlayer insulating layer II2. The wiring layer DE1 is electrically coupled to the wiring layer IC2 through a plug conductive layer PL2 buried in the through hole TH1. As shown in FIG. 6, the wiring layer SL is electrically coupled to the wiring layer IC1 through a plug conductive layer PL2 buried in the through hole TH2.

The wiring layer DE2 is formed on the second surface SS of the semiconductor substrate SUB. The wiring layer DE2 is in contact with the $n^+$ substrate region SB.

Next, the method for manufacturing a semiconductor device according to the first embodiment will be described referring to FIGS. 7 to 24. FIGS. 9 to 17 and FIGS. 19 to 24 show cross sections corresponding to the lines VII-VII and VIII-VIII of FIG. 6.

Figure 9:
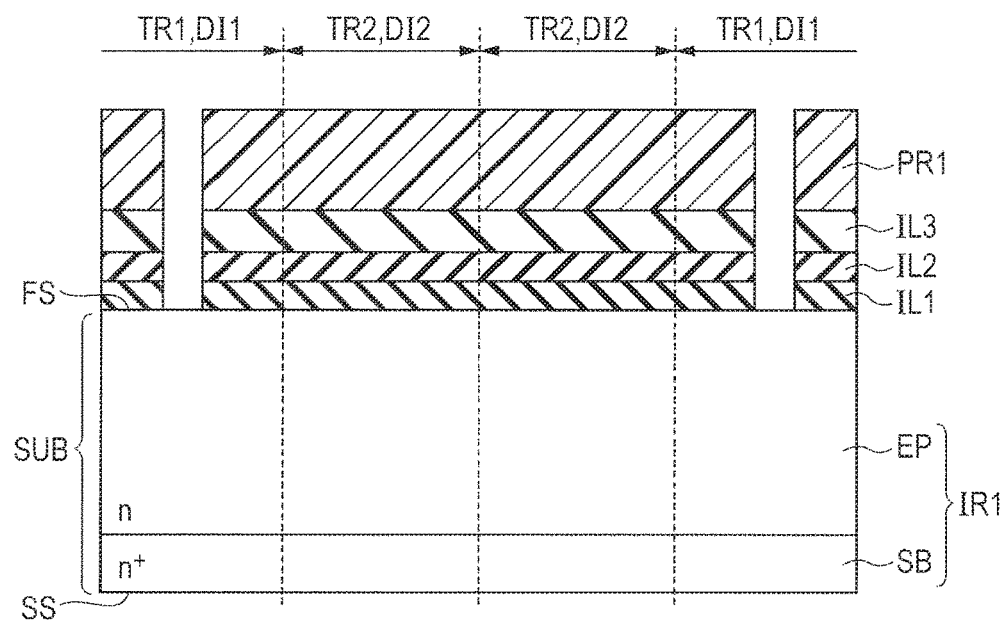
FIG. 9 is a schematic sectional view which shows the first step of the method for manufacturing the semiconductor device according to the first embodiment.

As shown in FIG. 9, an n-type epitaxial region EP is formed over an $n^+$ substrate region SB by epitaxial growth. Consequently, a semiconductor substrate SUB having a first surface FS and a second surface SS which are opposite to each other is provided. Also, an n-type impurity region IR1 having the $n^+$ substrate region SB and n-type epitaxial region EP is formed in the second surface of the semiconductor substrate SUB.

A silicon oxide film IL1, silicon nitride film IL2, and silicon oxide film IL3 are sequentially formed over the first surface FS of the semiconductor substrate SUB. A photoresist pattern PR1 is formed over the silicon oxide film IL3 by an ordinary photoengraving technique. The silicon oxide film IL3, silicon nitride film IL2, and silicon oxide film IL1 are sequentially etched using the photoresist pattern PR1 as a mask. Consequently, a through hole which penetrates the silicon oxide film IL3, silicon nitride film IL2, and silicon oxide film IL1 and reaches the first surface FS is made. Then, the photoresist pattern PR1 is removed, for example, by asking.

Figure 10:
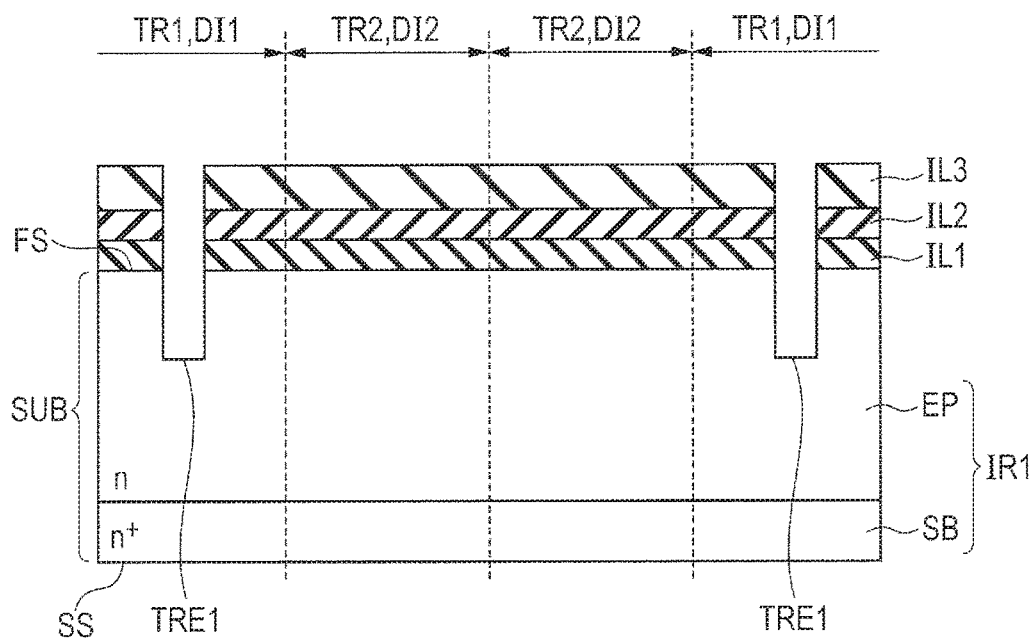
FIG. 10 is a schematic sectional view which shows the second step of the method for manufacturing the semiconductor device according to the first embodiment.

As shown in FIG. 10, etching is done on the semiconductor substrate SUB using the silicon oxide film IL3 as a mask. Consequently, a deep trench TRE1 is made in the first surface FS of the semiconductor substrate SUB.

Figure 11:
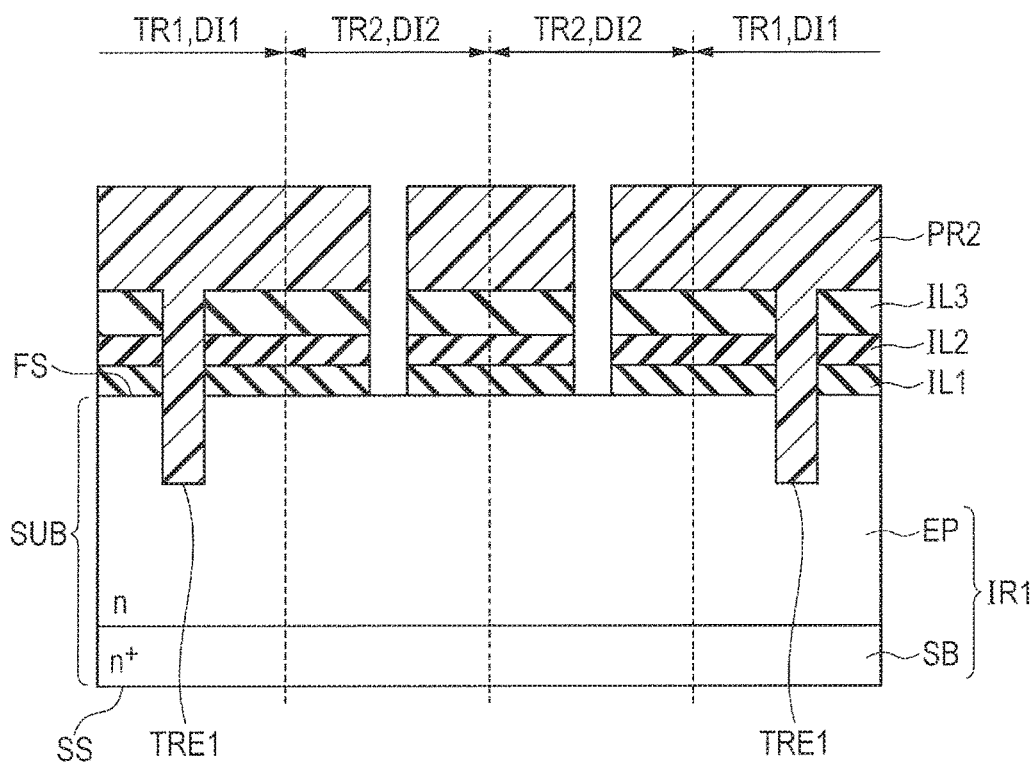
FIG. 11 is a schematic sectional view which shows the third step of the method for manufacturing the semiconductor device according to the first embodiment.

As shown in FIG. 11, photoresist PR2 is coated over the silicon oxide film IL3 in a manner to be buried in the deep trench TRE1. The photoresist PR2 is patterned by an ordinary photoengraving technique. The silicon oxide film IL3, silicon nitride film IL2, and silicon oxide film IL1 are sequentially etched using the photoresist pattern PR2 as a mask. Consequently, a through hole which penetrates the silicon oxide film IL3, silicon nitride film IL2, and silicon oxide film IL1 and reaches the first surface FS is made. Then, the photoresist pattern PR2 is removed, for example, by asking.

Figure 12:
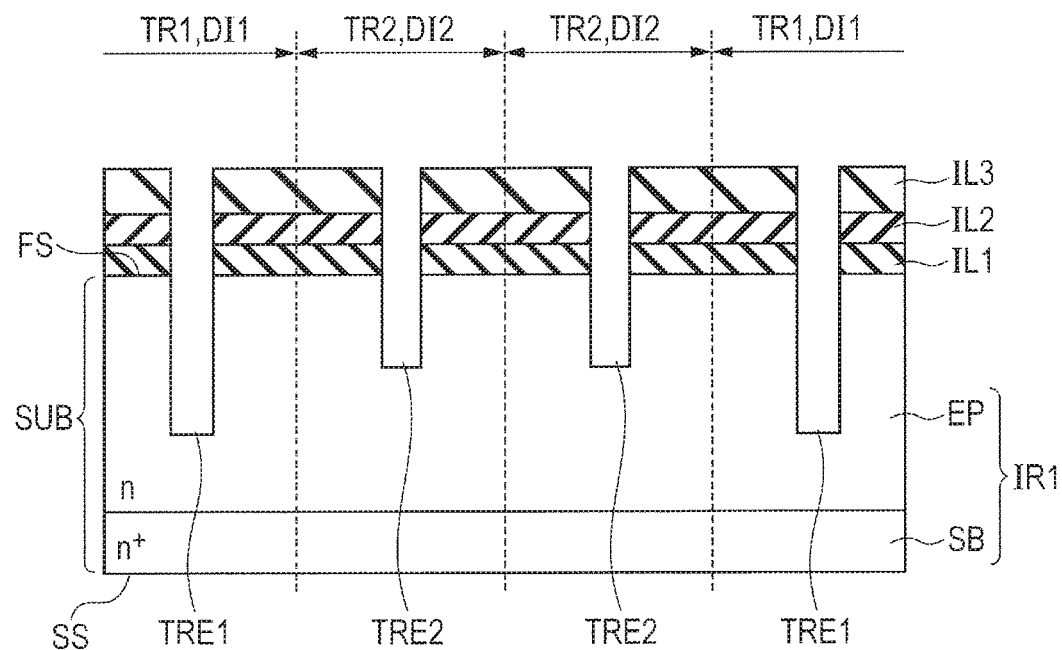
FIG. 12 is a schematic sectional view which shows the fourth step of the method for manufacturing the semiconductor device according to the first embodiment.

As shown in FIG. 12, etching is done on the semiconductor substrate SUB using the silicon oxide film IL3 as a mask. Consequently, a shallow trench TRE2 is made in the first surface FS of the semiconductor substrate SUB. Furthermore, the depth of the deep trench TRE1 is increased. Consequently, a deep trench TRE1 and a shallow trench TRE2 with a shallower depth than the deep trench TRE1 are made in the first surface FS of the semiconductor substrate SUB.

After this, the silicon oxide film IL3, silicon nitride film IL2, and silicon oxide film IL1 are sequentially removed by etching.

Figure 13:
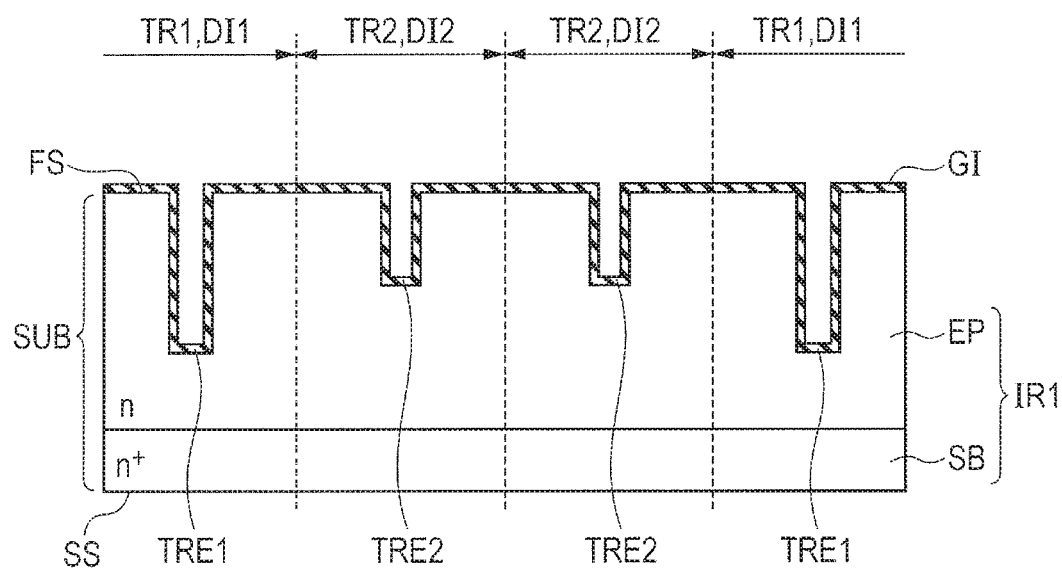
FIG. 13 is a schematic sectional view which shows the fifth step of the method for manufacturing the semiconductor device according to the first embodiment.

As shown in FIG. 13, the first surface FS of the semiconductor substrate SUB is exposed by the above etching step for removal. In this state, the exposed first surface FS is oxidized, for example, by thermal oxidation. Thermal oxidation is performed in an oxidative atmosphere, for example, at a temperature of 900° C. or more. As a result of this thermal oxidation, a thermally-oxidized film GI is formed on the first surface FS of the semiconductor substrate SUB, the wall face of the deep trench TRE1, and the wall face of the shallow trench TRE2.

Figure 14:
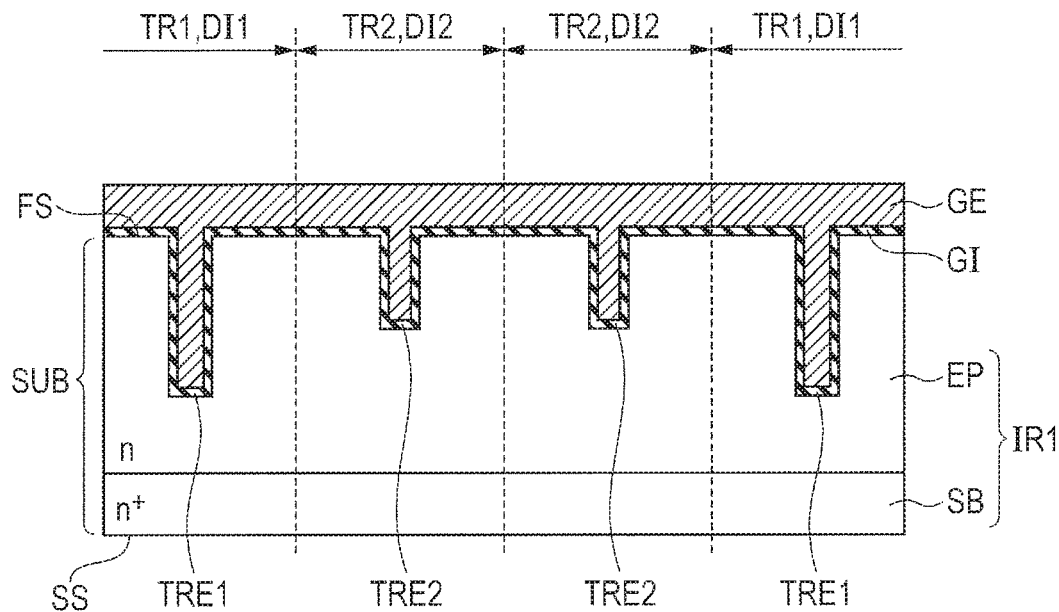
FIG. 14 is a schematic sectional view which shows the sixth step of the method for manufacturing the semiconductor device according to the first embodiment.

As shown in FIG. 14, a conductive layer GE, for example, of doped polysilicon is formed over the first surface FS in a manner to be buried in the deep trench TRE1 and shallow trench TRE2. The conductive layer GE is etched back.

Figure 15:
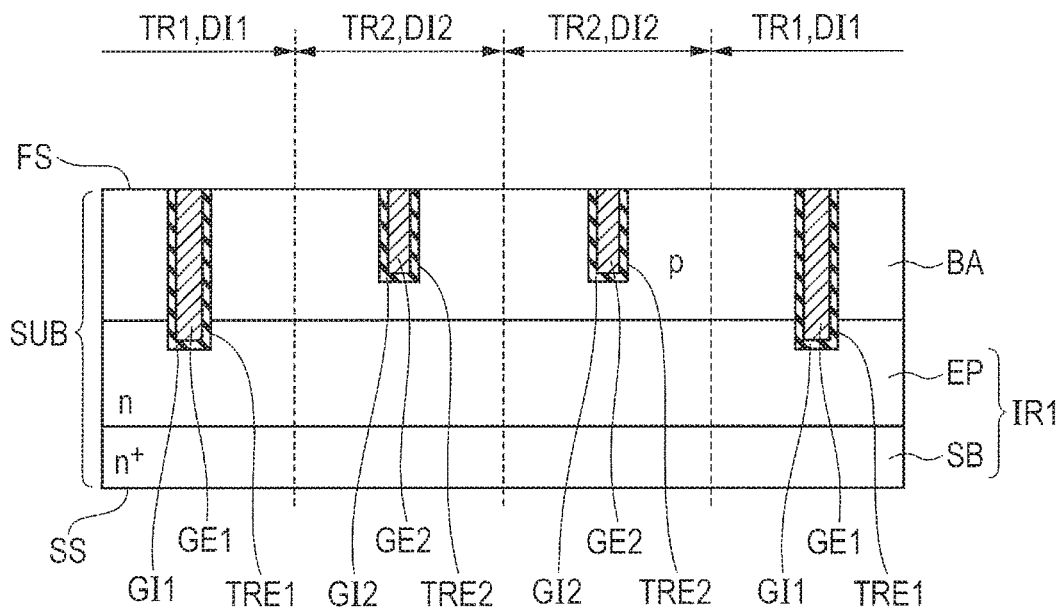
FIG. 15 is a schematic sectional view which shows the seventh step of the method for manufacturing the semiconductor device according to the first embodiment.

As shown in FIG. 15, the conductive layer GE over the first surface FS is removed by the above etching-back step except the conductive layer GE which is left in the deep trench TRE1 and shallow trench TRE2. The conductive layer GE left in the deep trench TRE1 becomes a gate electrode GE1 and the conductive layer GE left in the shallow trench TRE2 becomes a gate electrode GE2.

Boron ions are implanted in the first surface FS in the order of $10^{13}/cm^2$. Consequently, a p-type base region BA is formed in the first surface FS. The p-type base region BA is formed so as to make a pn junction with the n-type impurity region IR1. The p-type base region BA is formed so as to be shallower than the deep trench TRE1 and deeper than the shallow trench TRE2 with respect to the first surface FS. Consequently, the p-type base region BA is nearer to the first surface FS than the bottom face of the deep trench TRE1. The p-type base region BA is in contact with the side face of the deep trench TRE1 and also in contact with the bottom and side faces of the shallow trench TRE2. The n-type epitaxial region EP is in contact with the bottom face of the deep trench TRE1.

Figure 16:
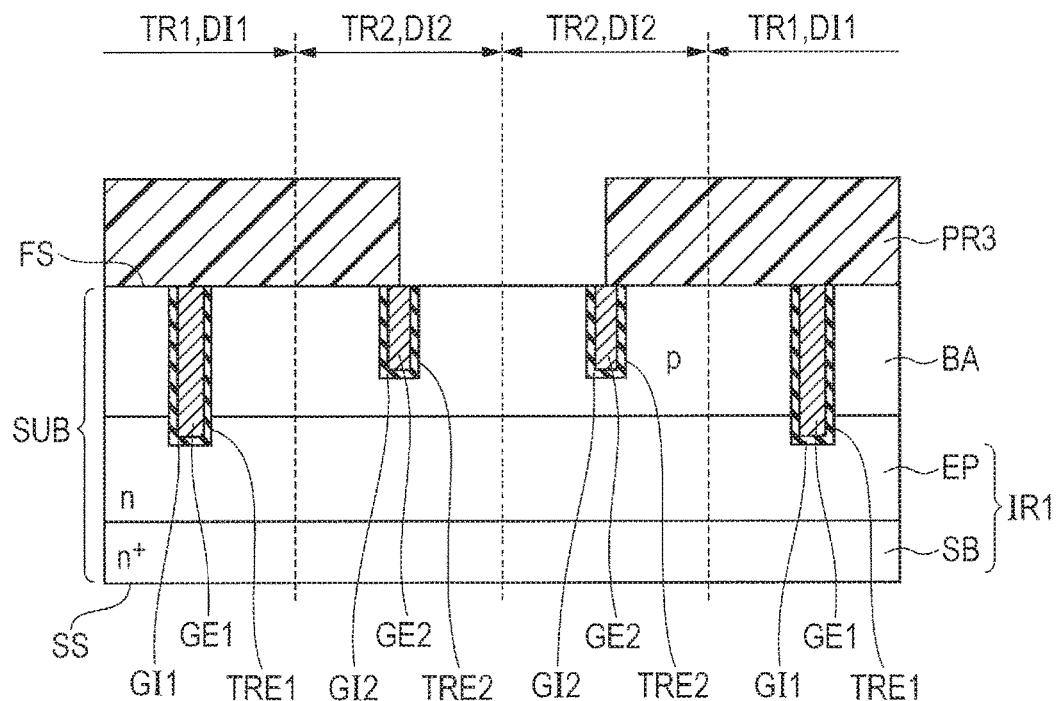
FIG. 16 is a schematic sectional view which shows the eighth step of the method for manufacturing the semiconductor device according to the first embodiment.

As shown in FIG. 16, a photoresist pattern PR3 is formed over the first surface FS by an ordinary photoengraving technique. Using the photoresist pattern PR3 as a mask, phosphorous ions are implanted in the first surface FS's area surrounded by the shallow trench TRE2. Then, the photoresist pattern PR3 is removed, for example, by asking.

Figure 17:
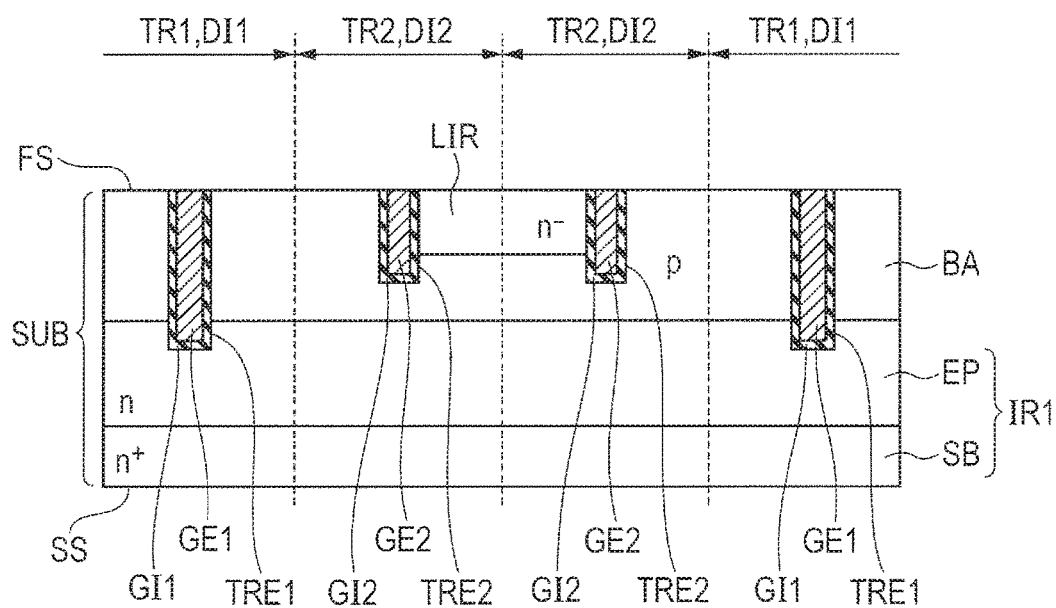
FIG. 17 is a schematic sectional view which shows the ninth step of the method for manufacturing the semiconductor device according to the first embodiment.

As shown in FIG. 17, an $n^-$ region LIR is formed in the first surface FS's area surrounded by the shallow trench TRE2 by the above ion implantation step. The $n^-$ region LIR is shallower than the bottom face of the shallow trench TRE2 with respect to the first surface FS. The $n^-$ region LIR is in contact with the side face of the shallow trench TRE2.

Figures 18A, 18B:
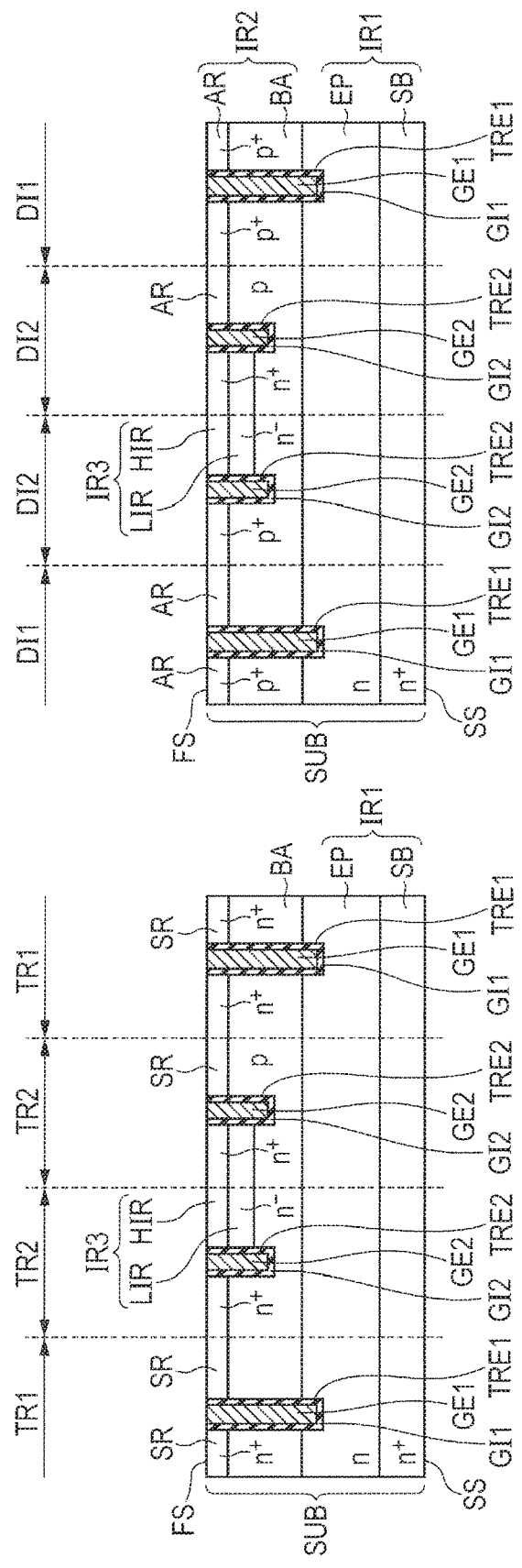

As shown in FIG. 18A, an $n^+$ region HIR and an $n^+$ source region SR are formed in the first surface FS by implanting n-type impurity ions. The $n^+$ region HIR is formed in the first surface FS's area surrounded by the shallow trench TRE2. The $n^+$ region HIR is joined to the $n^-$ region LIR and formed to lie in the first surface FS. The $n^+$ region HIR is in contact with the side face of the shallow trench TRE2.

The $n^+$ region HIR and $n^-$ region LIR make up an n-type impurity region IR3. Consequently, the n-type impurity region IR3 is formed in the first surface FS in a manner to make a pn junction with the p-type impurity region IR2 and be in contact with the side face of the shallow trench TRE2.

The $n^+$ source region SR is formed between the area between the deep trench TRE1 and shallow trench TRE2 in the first surface FS. The $n^+$ source region SR is formed so as to be in contact with the side face of the deep trench TRE1 and the side face of the shallow trench TRE2. The $n^+$ source region SR is formed so as to be shallower than the shallow trench TRE2 with respect to the first surface FS.

As shown in FIG. 18B, a $p^+$ back gate region AR is formed in the first surface FS by implanting p-type impurity ions. The $p^+$ back gate region AR is joined to the p-type base region BA and formed to lie in the first surface FS.

The $n^+$ region HIR and $n^+$ source region SR may be formed after the $p^+$ back gate region AR is formed, or after the $n^+$ region HIR and $n^+$ source region SR are formed, the $p^+$ back gate region AR may be formed.

The p$^+$ back gate region AR and p-type base region BA make up a p-type impurity region IR2.

Figure 19:
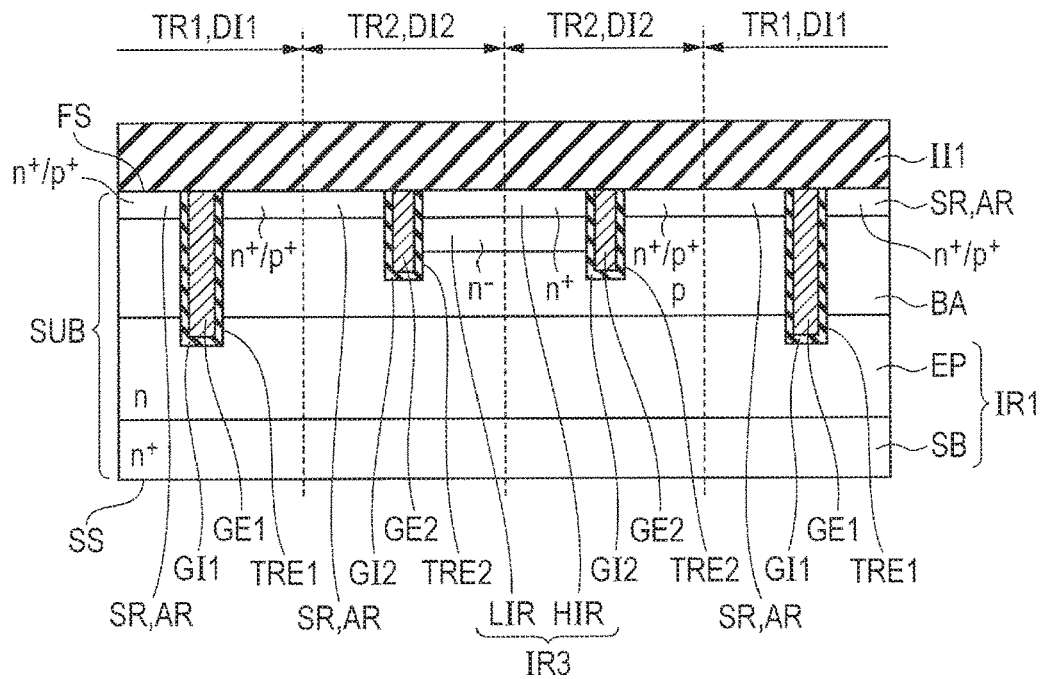
FIG. 19 is a schematic sectional view which shows the eleventh step of the method for manufacturing the semiconductor device according to the first embodiment.

As shown in FIG. 19, an interlayer insulating layer II1 is formed over the first surface FS of the semiconductor substrate SUB. The interlayer insulating layer II1 is formed, for example, using an organic compound called TEOS (TetraEthyl OthoSilicate) as a basic ingredient, by a decompression CVD (Chemical Vapor Deposition) method which uses ozone.

Figure 20:
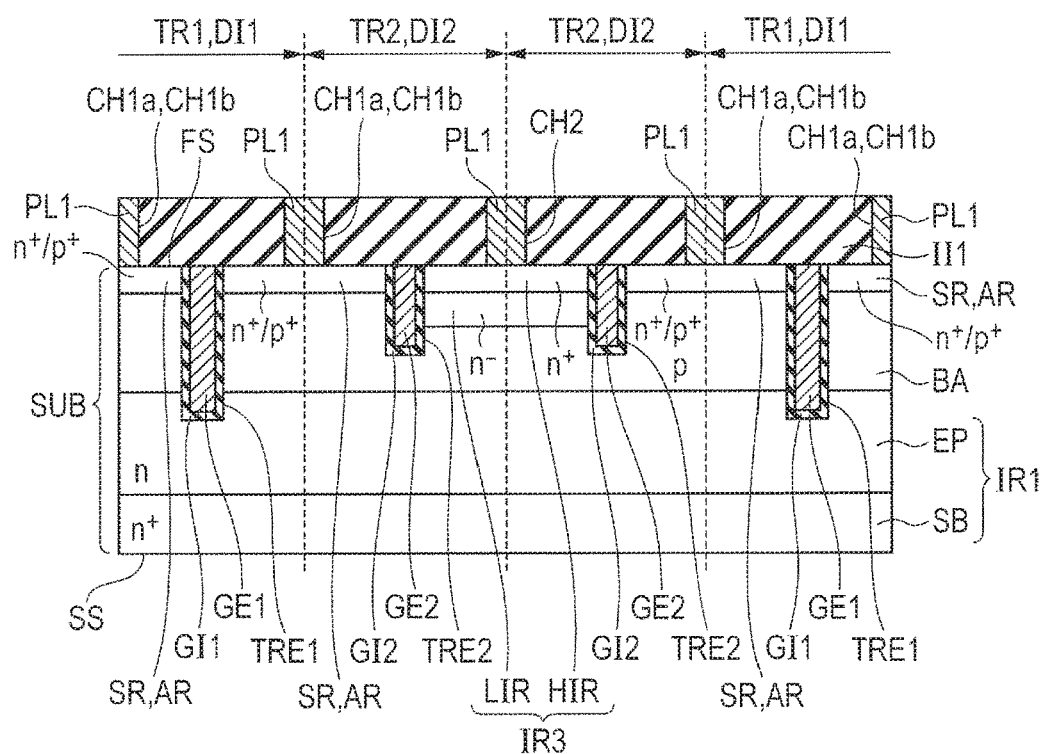
FIG. 20 is a schematic sectional view which shows the twelfth step of the method for manufacturing the semiconductor device according to the first embodiment.

As shown in FIG. 20, contact holes CH1a, CH1b, CH2, CH3 (FIG. 5), and CH4 (FIG. 5) are made in the interlayer insulating film II1 by an ordinary photoengraving technique and an etching technique. A plug conductive layer PL1 is buried in each of these contact holes CH1a, CH1b, CH2, CH3, and CH4.

Figure 21:
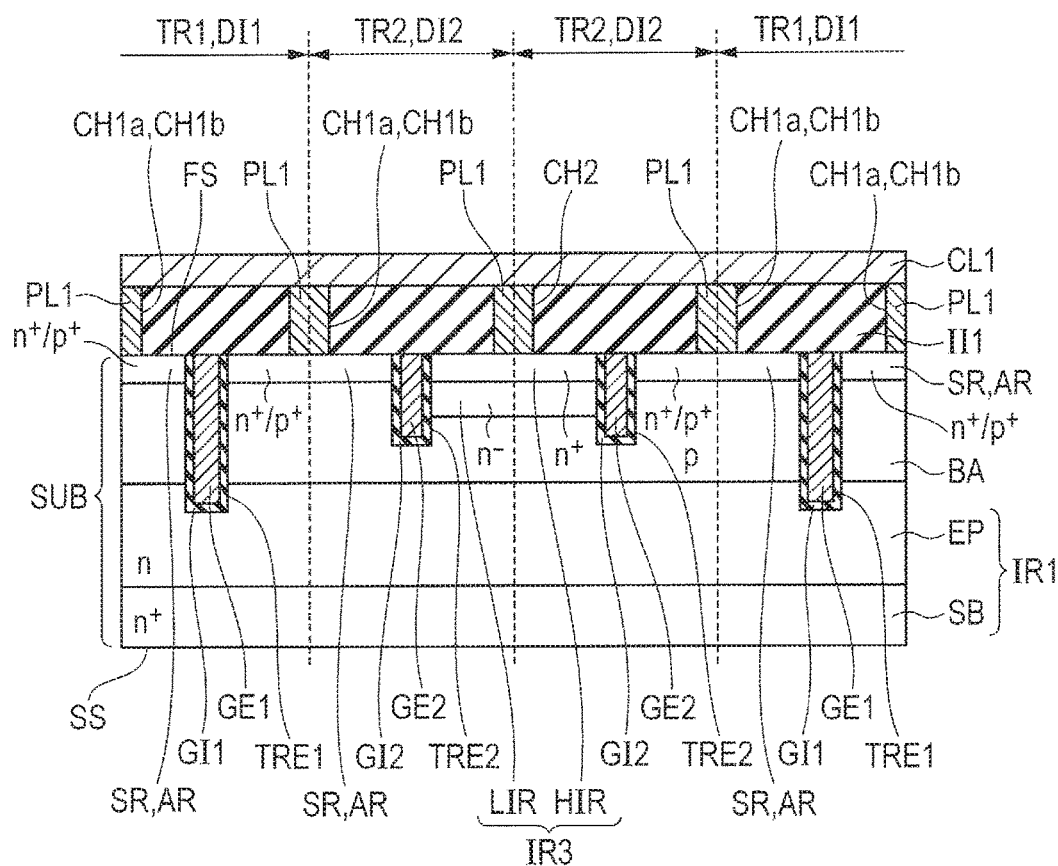
FIG. 21 is a schematic sectional view which shows the thirteenth step of the method for manufacturing the semiconductor device according to the first embodiment.

As shown in FIG. 21, a wiring conductive layer CL1 is formed over the interlayer insulating layer II1. The wiring conductive layer CL1 is formed, for example, by sputtering aluminum.

Figure 22:
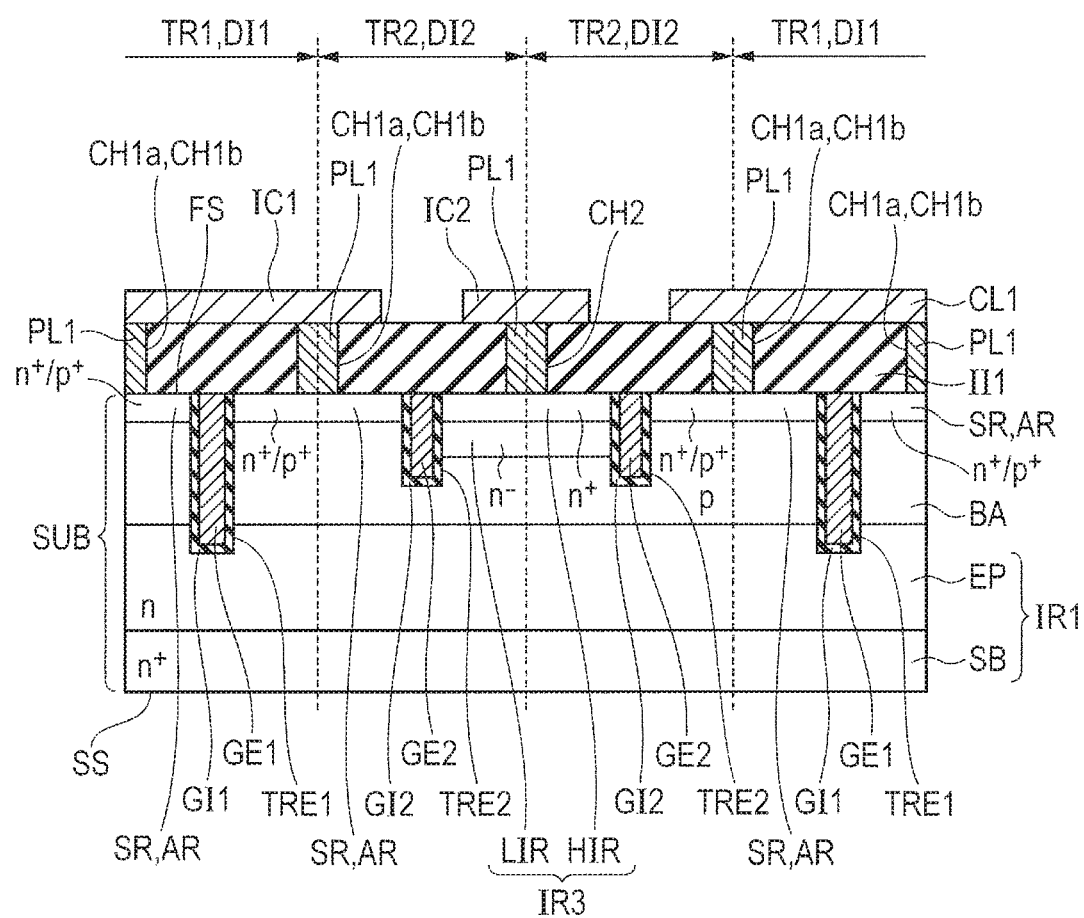
FIG. 22 is a schematic sectional view which shows the fourteenth step of the method for manufacturing the semiconductor device according to the first embodiment.

As shown in FIG. 22, the wiring conductive layer CL1 is patterned by an ordinary photoengraving technique and a dry etching technique. Consequently, wiring layers IC1, IC2, GL1 (FIG. 6), and GL2 (FIG. 6) are formed from the wiring conductive layer CL1.

Figure 23:
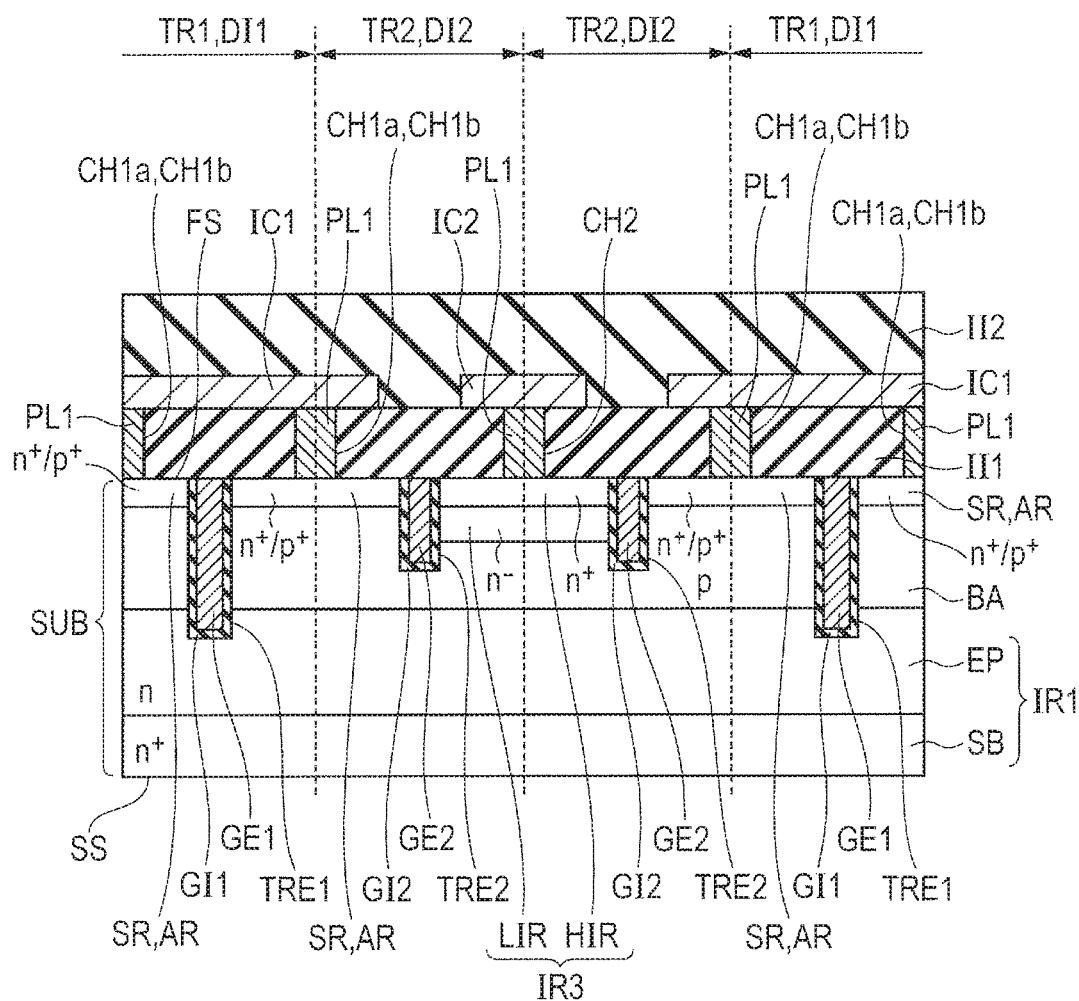
FIG. 23 is a schematic sectional view which shows the fifteenth step of the method for manufacturing the semiconductor device according to the first embodiment.

As shown in FIG. 23, an interlayer insulating layer 112 is formed over the interlayer insulating layer II1.

Figure 24:
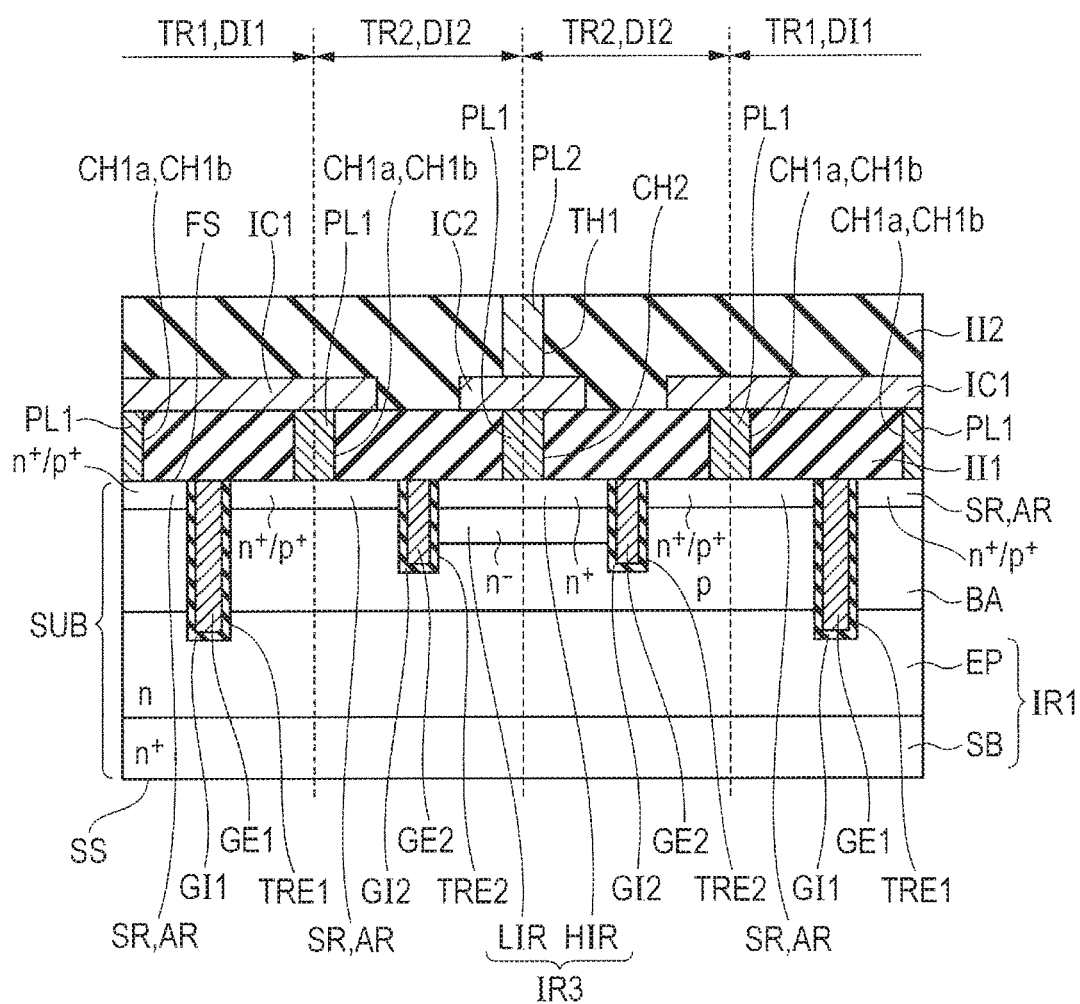
FIG. 24 is a schematic sectional view which shows the sixteenth step of the method for manufacturing the semiconductor device according to the first embodiment.

As shown in FIG. 24, through holes TH1 and TH2 (FIG. 6) are made in the interlayer insulating film 112 by an ordinary photoengraving technique and an etching technique. A plug conductive layer PL2 is buried in each of these through holes TH1 and TH2.

As shown in FIGS. 7 and 8, a wiring conductive layer is formed over the interlayer insulating layer 112, for example, by sputtering aluminum, and then it is patterned by an ordinary photoengraving technique and a dry etching technique. Consequently, wiring layers DE1 and SL (FIG. 6) are formed from the above wiring conductive layer. Then, the wafer is divided into chips by dicing, etc.

With the above steps, the semiconductor device CH according to the first embodiment is manufactured.

Next, operation of the semiconductor device according to the first embodiment will be described.

In this embodiment, when the power supply is normal, a voltage with respect to the source terminal is applied to the gate terminal of the nMOS transistor TR2 included in the reverse coupling protection element EL2. This turns on the nMOS transistor TR2. Also, a voltage with respect to the source terminal is applied to the gate terminal of the nMOS transistor TR1 included in the energization control element EL1. This turns on the nMOS transistor TR1. Consequently, a current flows from the power supply BAT to the load LO.

When the power supply is normal, by turning off the nMOS transistor TR1 included in the energization control element EL1, the parasitic diode of the nMOS transistor TR1 is reversely biased to turn off the current.

If the power supply BAT is reversely coupled, the gate terminal of the nMOS transistor TR2 is shorted with its source terminal, which turns off the nMOS transistor TR2. Consequently, the parasitic diode of the nMOS transistor TR2 is reversely biased and the current is turned off.

Next, the effects of this embodiment will be described.

In this embodiment, as shown in FIGS. 7 and 8, both an energization control element EL1 and a reverse coupling protection element EL2 are formed in one semiconductor device CH. The increase in cost is smaller than when an energization control element EL1 and a reverse coupling protection element EL2 are provided in different semiconductor devices.

Furthermore, in this embodiment, as shown in FIGS. 7 and 8, the deep trench TRE1 penetrates the p-type base region BA. This makes it possible that one of the paired source/drain regions of the nMOS transistor TR1 included in the energization control element EL1 is located in the first surface FS and the other is located in the second surface SS. Furthermore, the p-type base region BA is in contact with the bottom face of the shallow trench TRE2. This makes it possible that the paired source/drain regions of the nMOS transistor TR2 included in the reverse coupling protection element EL2 are located in the first surface FS.

This means that one of the source and drain of the nMOS transistor TR1 and one of the source and drain of the nMOS transistor TR2 can share one region in the first surface FS. Therefore, the structure can be easily simplified.

Therefore, according to this embodiment, it is possible to provide a semiconductor device CH which includes both an energization control element EL1 and a reverse coupling protection element EL2 and has a simplified structure.

In this embodiment, as shown in FIG. 3, the drain of the nMOS transistor TR1 is coupled to the power supply BAT and the drain of the nMOS transistor TR2 is coupled to the load LO. In other words, the terminals of the semiconductor device CH according to this embodiment as a product are the two drains. Therefore, restrictions on circuit operation and restrictions on path design are less than when the terminals of the product are two sources as in the device described in Japanese Unexamined Patent Application Publication No. 2013-38908. Next, this will be explained by comparison with the structure of the device described in Japanese Unexamined Patent Application Publication No. 2013-38908.

Figure 25:
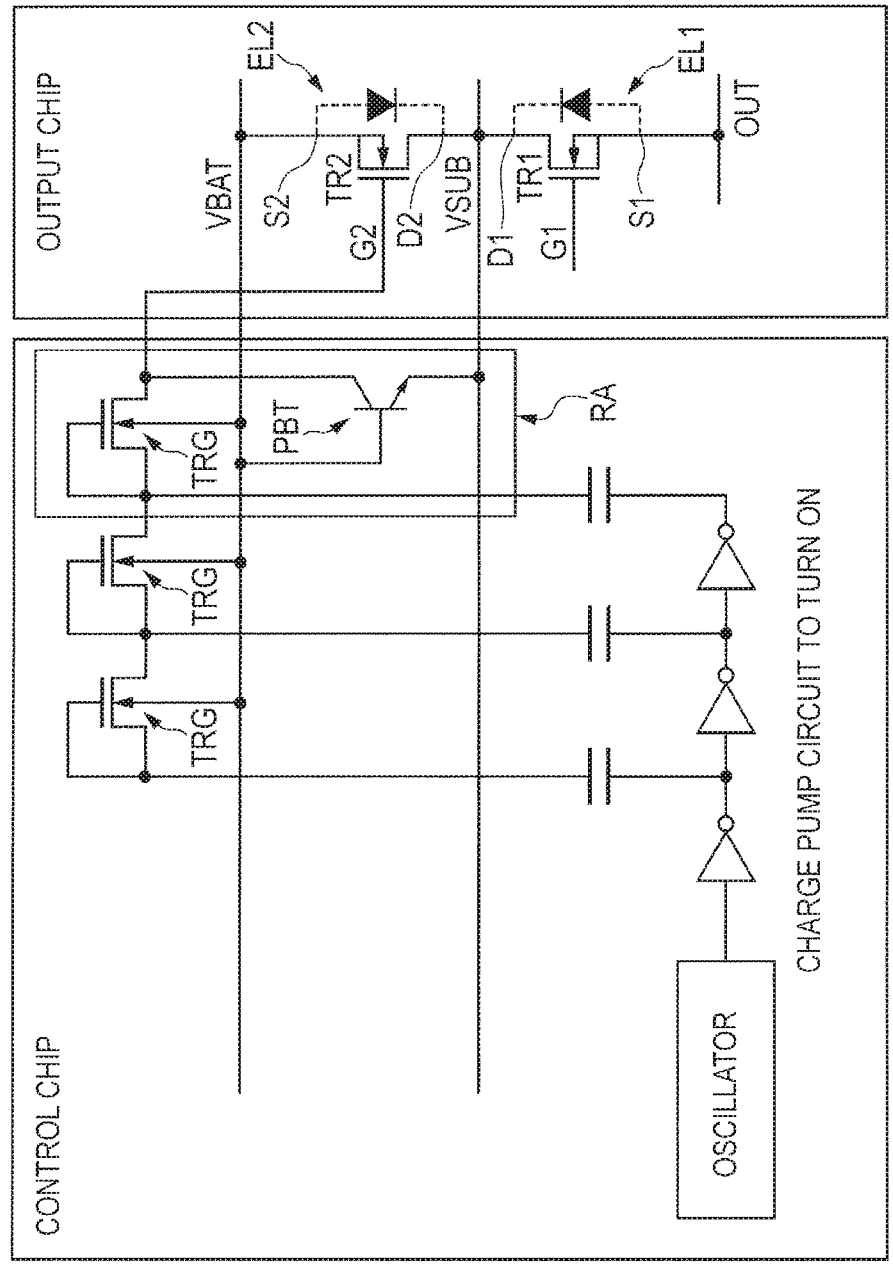
FIG. 25 is a circuit diagram which illustrates the difficulty in increasing the voltage to the required level to turn on a reverse coupling protection element in a comparative example.

In Japanese Unexamined Patent Application Publication No. 2013-38908, in order to drive both the semiconductor element EL1 for energization control and the semiconductor element EL2 for protection against power supply reverse coupling by high side coupling as shown in FIG. 25, the voltages of the gates G1 and G2 of the nMOS transistors TR1 and TR2 included in the elements EL1 and EL2 must be higher than the voltages of their sources S1 and S2 respectively. In the semiconductor element EL1 for energization control, the drain D1 is coupled to the high potential side (power supply BAT) and the source S1 is coupled to the low potential side (output OUT). Therefore, if the gate boosting circuit is configured with respect to the source S1, the semiconductor element EL1 for energization control can be driven.

However, in the semiconductor element EL2 for protection against power supply reverse coupling, the drain D2 is coupled to the low potential side (output OUT) and the source S2 is coupled to the high potential side (power supply BAT). In addition, the back gate of the nMOS transistor TRG of the gate boosting circuit is coupled to the power supply voltage VBAT.

Figure 26:
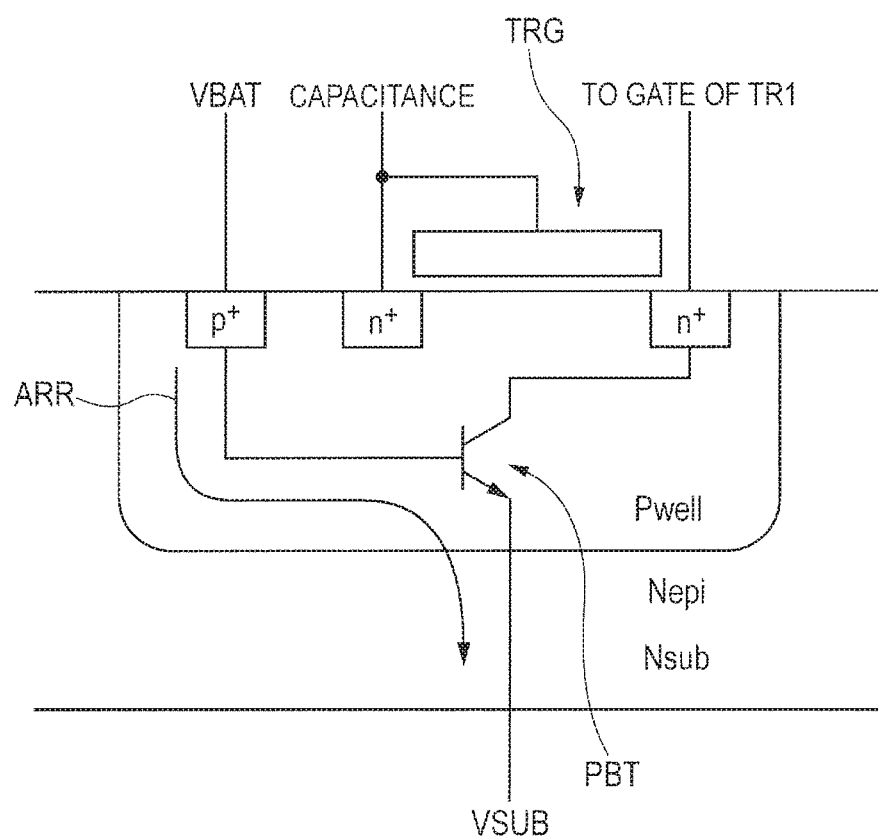
FIG. 26 is a sectional view which shows the area RA in FIG. 25 for illustrating the difficulty in increasing the voltage to the required level to turn on the reverse coupling protection element in the comparative example.

As shown in FIG. 26, the nMOS transistor TRG for the boosting circuit has a parasitic npn transistor PBT which includes an n-type epitaxial region, p-type well region, and n$^+$ region. Therefore, even when supply voltage VBAT is applied to the back gate of the nMOS transistor TRG, the parasitic diode of the parasitic npn transistor PBT causes a current to flow as indicated by arrow ARR and this current becomes the base current for the parasitic npn transistor PBT, which turns on the parasitic npn transistor PBT.

As a result, the voltage of the gate G2 of the semiconductor element EL2 for protection against power supply reverse coupling cannot become higher than the supply voltage VBAT. For this reason, the circuit described in Japanese Unexamined Patent Application Publication No. 2013-38908 has the following problem: if a charge pump circuit which uses a transistor is used, the voltage required to turn on the nMOS transistor TR2 of the semiconductor element EL2 for protection against power supply reverse coupling cannot be attained by boosting. Specifically, there are many restrictions on circuit operation and path design.

In contrast, in this embodiment, as shown in FIG. 3, the drain D1 of the energization control element EL1 is coupled to the power supply BAT. Therefore, the problem that the voltage required to turn on the nMOS transistor TR1 of the energization control element EL1 cannot be attained does not occur. In addition, the reverse coupling protection element EL2 is located nearer to the load LO than the energization control element EL1. For this reason, the problem that the voltage required to turn on the nMOS transistor TR2 of the reverse coupling protection element EL2 cannot be attained does not occur. Therefore, in this embodiment, restrictions on circuit operation and restrictions on path design are fewer.

According to Japanese Unexamined Patent Application Publication No. 2013-38908, as shown in FIG. 25, the drain D1 of the semiconductor element EL1 for energization control and the drain D2 of the semiconductor element EL2 for protection against power supply reverse coupling are coupled to each other. Therefore, when the semiconductor element EL1 for energization control and the semiconductor element EL2 for protection against power supply reverse coupling are formed in one semiconductor chip, the terminal for the source S1 of the semiconductor element EL1 for energization control and the terminal for the source S2 of the semiconductor element EL2 for protection against power supply reverse coupling are terminals of the product. For this reason, at least two source terminals are required on one surface of the semiconductor chip, which makes it difficult to ensure that the area for a source terminal is large enough. Therefore, it is difficult to couple many wires to a source terminal, which results in an increase in the electric resistance of a wire.

On the other hand, in this embodiment, the drain (n-type impurity region IR1) of the nMOS transistor TR1 lies in the second surface SS and the drain (n-type impurity region IR3) of the nMOS transistor TR2 lies in the first surface FS. The electrode pads for the two drains are separately located on the first surface FS and the second surface SS. Consequently, the area for each electrode pad can be larger than when two electrode pads are located on the same surface. Therefore, many bonding wires can be coupled to each electrode pad, which can suppress an increase in the electric resistance of bonding wires.

According to Japanese Unexamined Patent Application Publication No. 2013-38908, as shown in FIG. 25, the semiconductor element EL2 for protection against power supply reverse coupling is coupled between the semiconductor element EL1 for energization control and the power supply. Therefore, in order to turn on when the power supply is normally coupled, the semiconductor element EL2 for protection against power supply reverse coupling must be turned on before the semiconductor element EL1 for energization control is turned on. If the semiconductor element EL2 for protection against power supply reverse coupling is turned on after the semiconductor element EL1 for energization control is turned on, the potential between the source and drain of the semiconductor element EL1 for energization control would be unstable until the drain voltage of the semiconductor element EL2 for protection against power supply reverse coupling rises to the maximum level and during the period of instability, a malfunction might occur.

On the other hand, in this embodiment, as shown in FIG. 3, the reverse coupling protection element EL2 is not located between the energization control element EL1 and the power supply BAT. Therefore, the problem that the potential between the source and drain of the energization control element EL1 is unstable until the drain voltage of the reverse coupling protection element EL2 rises to the maximum level does not occur.

Second Embodiment

Figure 27:
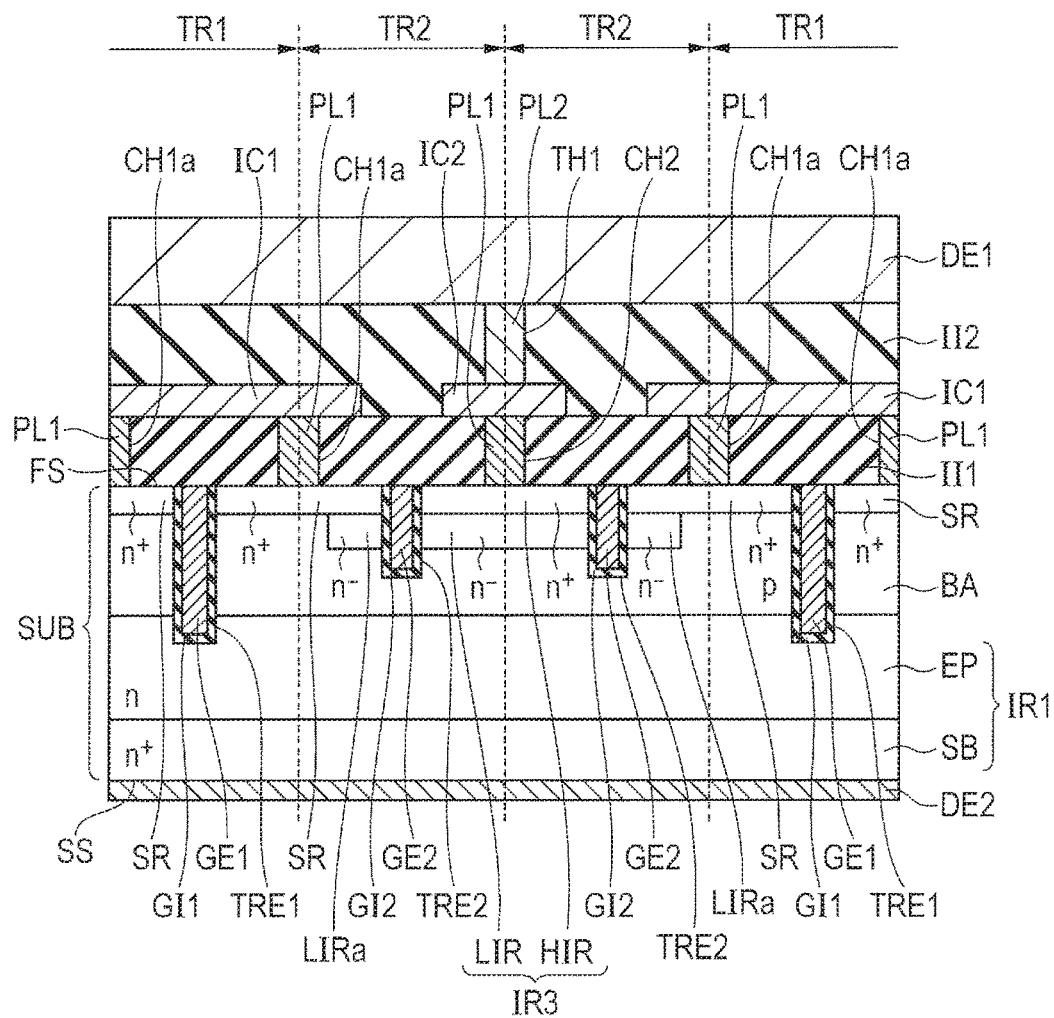
FIG. 27 is a schematic sectional view which shows the cross section of a semiconductor device according to a second embodiment of the invention which corresponds to the cross section taken along the line VII-VII of FIGS. 5 and 6.
Figure 28:
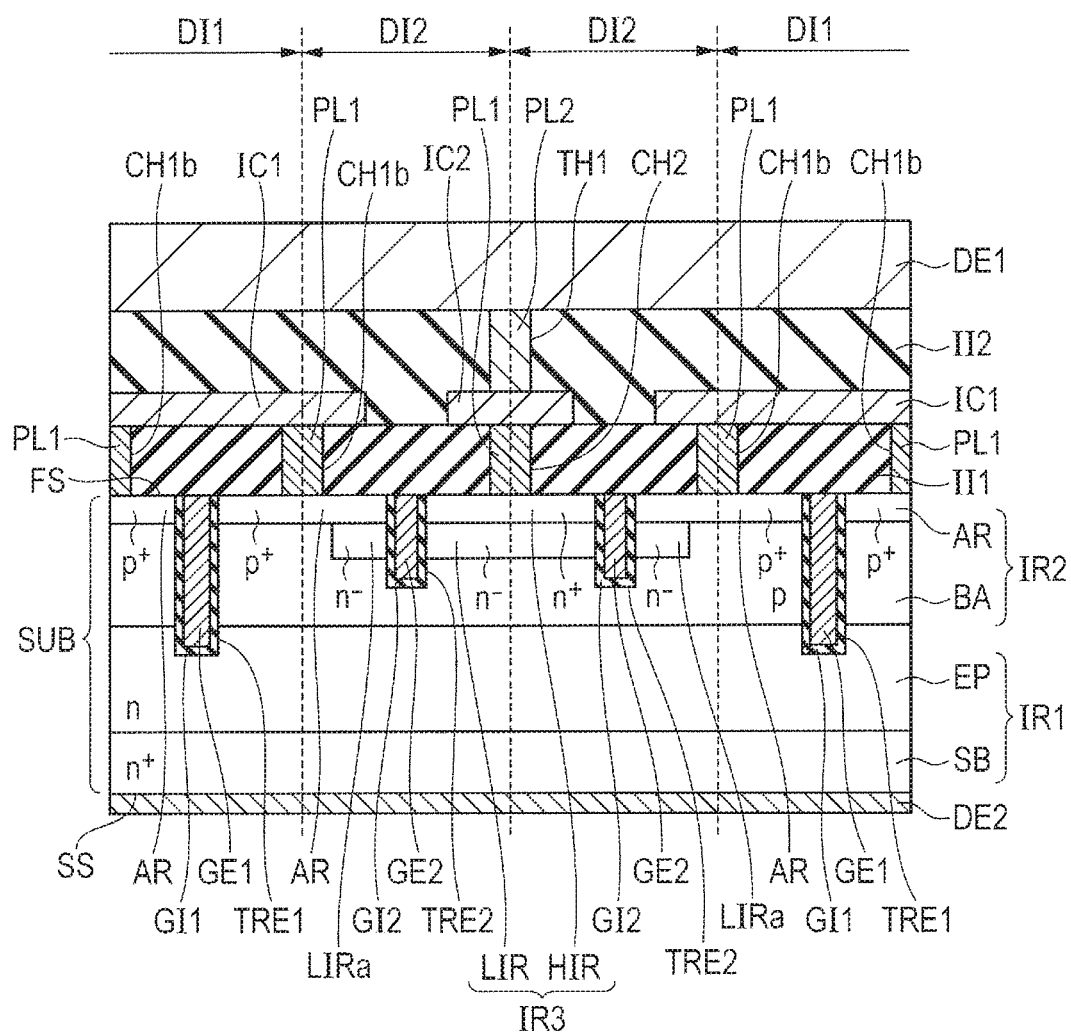
FIG. 28 is a schematic sectional view which shows the cross section of a semiconductor device according to the second embodiment which corresponds to the cross section taken along the line VIII-VIII of FIGS. 5 and 6.

As shown in FIGS. 27 and 28, the second embodiment is different from the first embodiment in that an $n^-$ region LIRa is added. The $n^-$ region LIRa is located in an area between the deep trench TRE1 and shallow trench TRE2. The $n^-$ region LIRa is in contact with the side face of the shallow trench TRE2 and joined to the $n^+$ source region SR and $p^+$ back gate region AR. The $n^-$ region LIRa is an extension of the $n^-$ region LIR formed in the area surrounded by the shallow trench TRE2, along the direction in which the first surface FS extends, and is a region separated from the $n^-$ region LIR by the shallow trench TRE2. The $n^-$ region LIRa has the same impurity concentration as the $n^-$ region LIR and has a lower n-type impurity concentration than the source region SR.

The other elements in this embodiment are almost the same as in the first embodiment, so the same elements as in the first embodiment are designated by the same reference signs and their description is not repeated.

Even in the structure in which the $n^-$ region LIRa is added in this way, the same effects as in the first embodiment can be brought about.

Furthermore, due to the addition of the $n^-$ region LIRa, the channel length of the nMOS transistor TR2 included in the reverse coupling protection element EL2 is shortened. As a consequence, the on-resistance is lower than in the first embodiment.

Third Embodiment

In the first embodiment, as shown in FIG. 4, among a plurality of unit cells C, the deep trenches TRE1 of unit cells C adjacent to each other in plan view are separated from each other.

Figure 29:
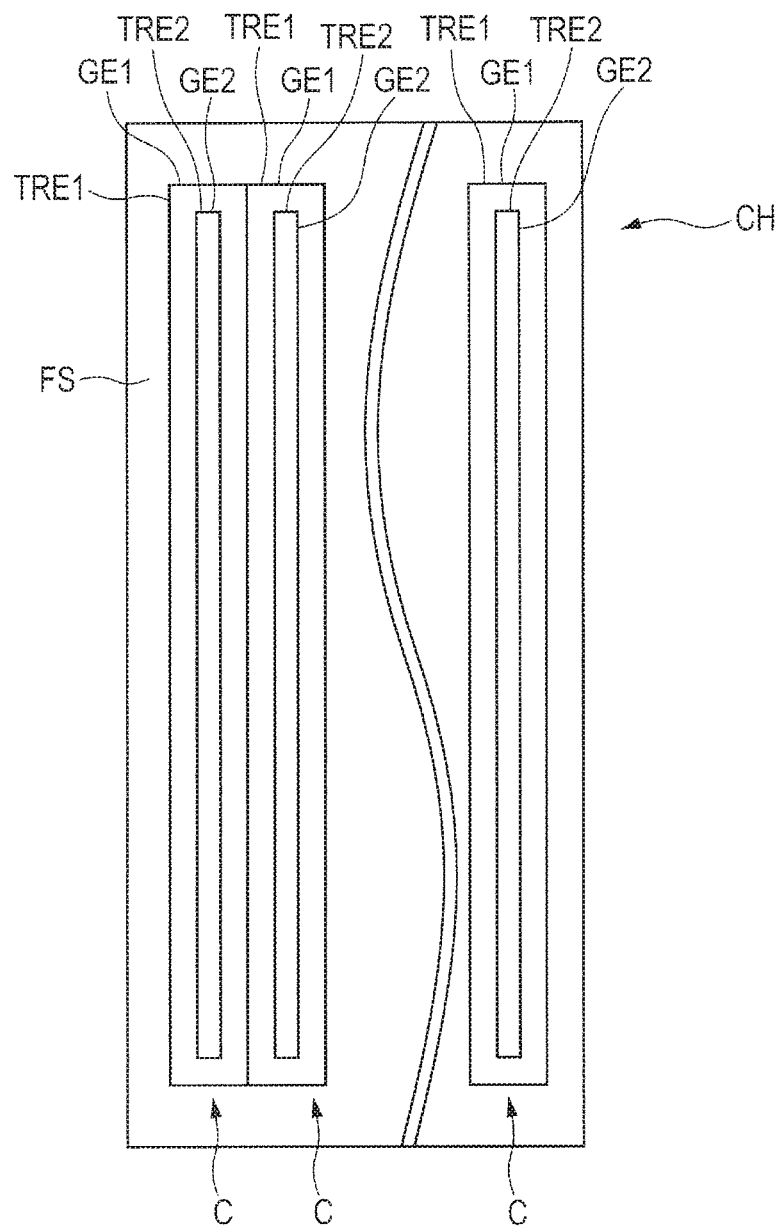
FIG. 29 is a plan view which shows the arrangement of trenches for gate electrodes in the first surface of a semiconductor device according to a third embodiment of the invention.

In contrast, in the third embodiment, as shown in FIG. 29, among a plurality of unit cells C, the deep trenches TRE1 of unit cells C adjacent to each other in plan view are joined to each other.

The other elements in this embodiment are almost the same as in the first embodiment, so the same elements as in the first embodiment are designated by the same reference signs and their description is not repeated.

The third embodiment brings about the same effects as the first embodiment.

In the third embodiment, the plane occupied area of the reverse coupling protection element EL2 per unit area in the first surface FS is increased to reduce the on-resistance.

Fourth Embodiment

Figure 30:
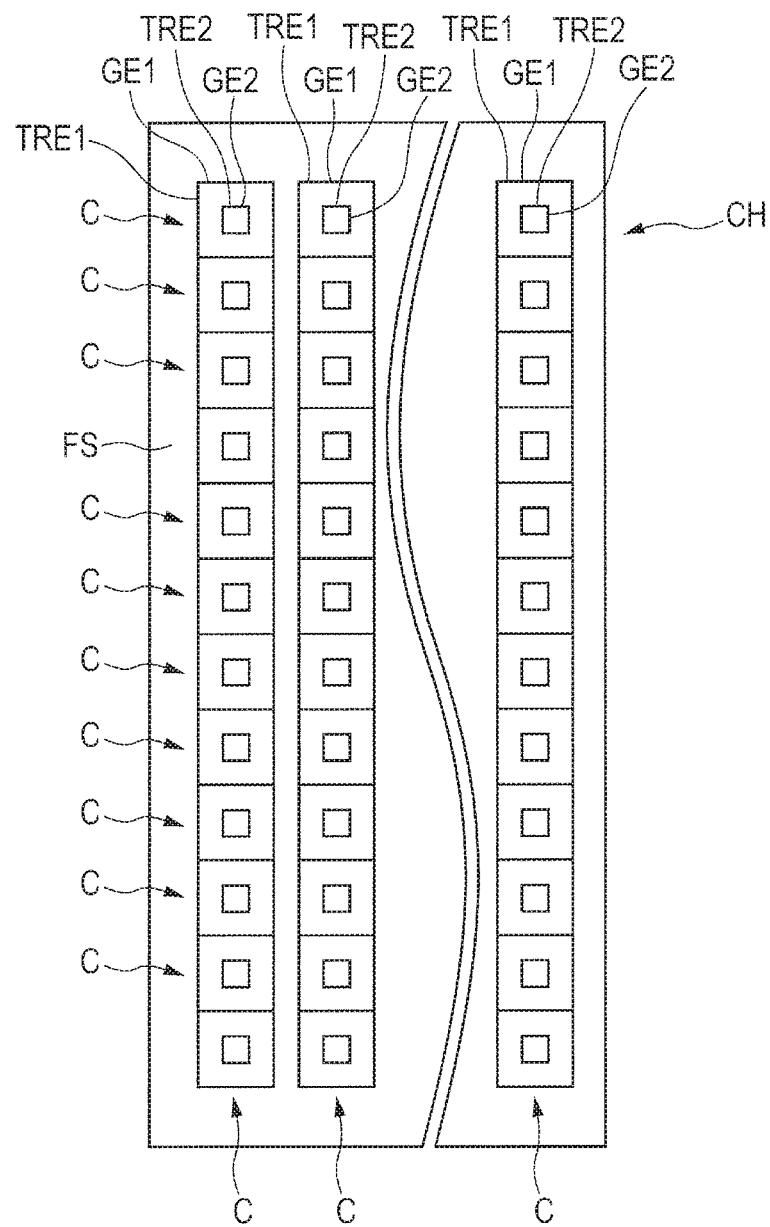
FIG. 30 is a plan view which shows the arrangement of trenches for gate electrodes in the first surface of a semiconductor device according to a fourth embodiment of the invention.

As shown in FIG. 30, in comparison with the structure of the first embodiment as shown in FIG. 4, the fourth embodiment is different in the arrangement of unit cells C. In the fourth embodiment, a plurality of unit cells C are arranged in a matrix pattern on the first surface FS. Among a plurality of unit cells C arranged in a first direction (horizontal direction in the figure) on the first surface FS, the deep trenches TRE1 of unit cells C adjacent to each other in plan view are separated from each other. Among a plurality of unit cells C arranged in a second direction perpendicular to the first direction (vertical direction in the figure) on the first surface FS, the deep trenches TRE1 of unit cells C adjacent to each other in plan view are joined to each other.

The other elements in this embodiment are almost the same as in the first embodiment, so the same elements as in the first embodiment are designated by the same reference signs and their description is not repeated.

The fourth embodiment brings about the same effects as the first embodiment.

Furthermore, in the fourth embodiment, the channel width of the nMOS transistor TR1 included in the energization control element EL1 can be increased. As a result, the on-resistance can be reduced.

Fifth Embodiment

Figure 31:
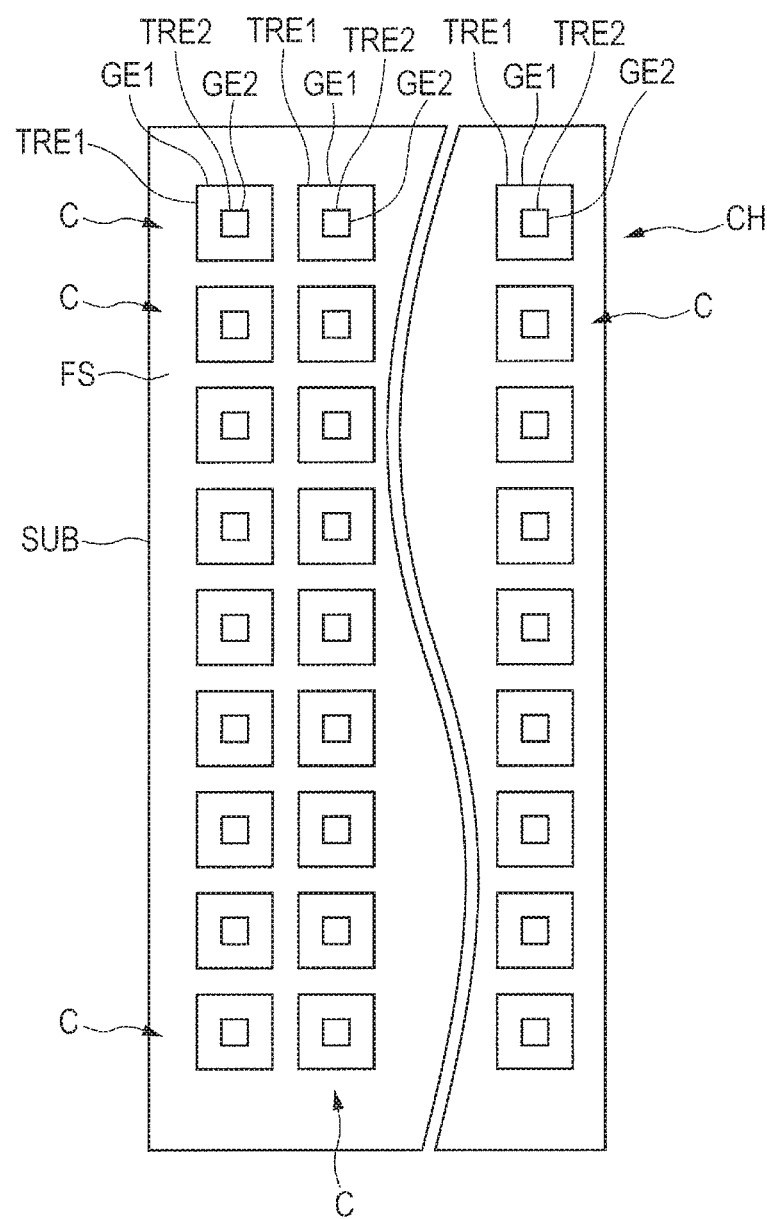
FIG. 31 is a plan view which shows the arrangement of trenches for gate electrodes in the first surface of a semiconductor device according to a fifth embodiment of the invention.

As shown in FIG. 31, in comparison with the structure of the first embodiment as shown in FIG. 4, the fifth embodiment is different in the arrangement of unit cells C. In the fifth embodiment, a plurality of unit cells C are arranged in a matrix pattern on the first surface FS. Among a plurality of unit cells C arranged in a first direction (horizontal direction in the figure) on the first surface FS, the deep trenches TRE1 of unit cells C adjacent to each other in plan view are separated from each other. Also, among a plurality of unit cells C arranged in a second direction perpendicular to the first direction (vertical direction in the figure) on the first surface FS, the deep trenches TRE1 of unit cells C adjacent to each other in plan view are separated from each other.

The other elements in this embodiment are almost the same as in the first embodiment, so the same elements as in the first embodiment are designated by the same reference signs and their description is not repeated.

The fifth embodiment brings about the same effects as the first embodiment.

Furthermore, in the fifth embodiment, the channel width of the nMOS transistor TR1 included in the energization control element EL1 can be maximized. As a result, the on-resistance can be reduced.

Sixth Embodiment

Figure 32:
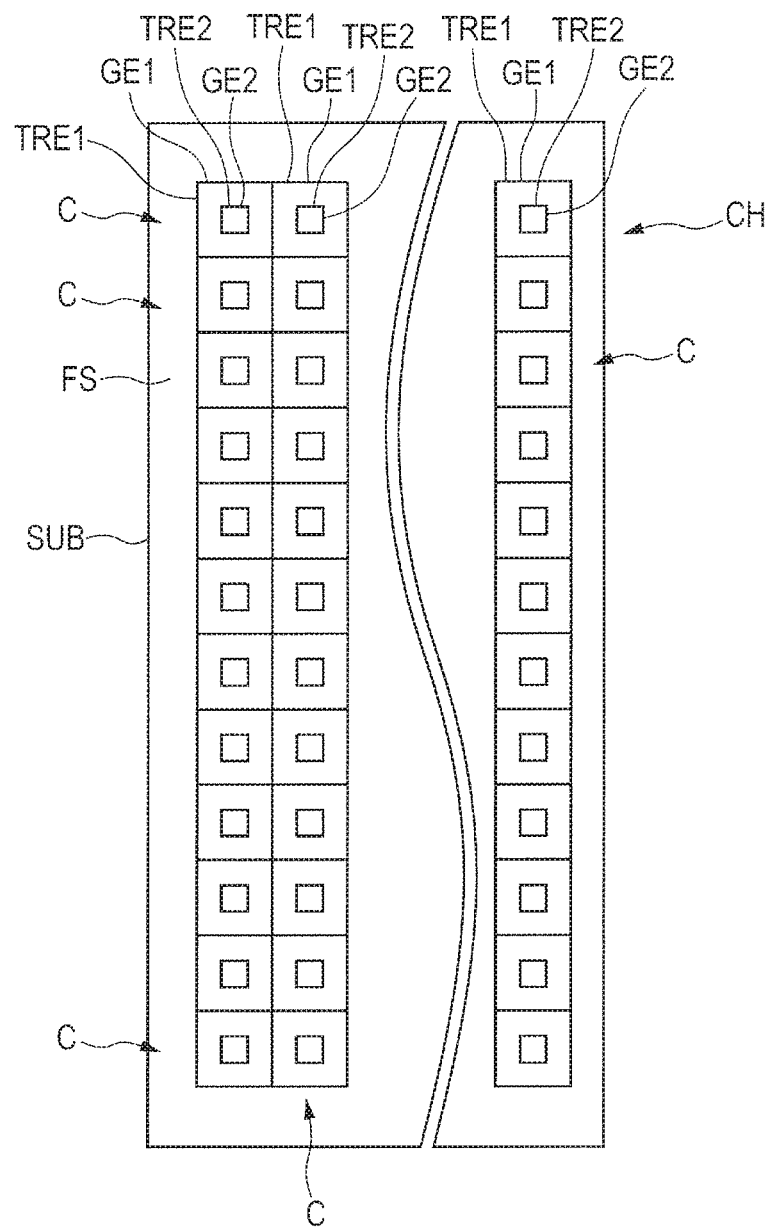
FIG. 32 is a plan view which shows the arrangement of trenches for gate electrodes in the first surface of a semiconductor device according to a sixth embodiment of the invention.

As shown in FIG. 32, in comparison with the structure of the first embodiment as shown in FIG. 4, the sixth embodiment is different in the arrangement of unit cells C. In the sixth embodiment, a plurality of unit cells C are arranged in a matrix pattern on the first surface FS. Among a plurality of unit cells C arranged in a first direction (horizontal direction in the figure) on the first surface FS, the deep trenches TRE1 of unit cells C adjacent to each other in plan view are joined to each other. Also, among a plurality of unit cells C arranged in a second direction perpendicular to the first direction (vertical direction in the figure) on the first surface FS, the deep trenches TRE1 of unit cells C adjacent to each other in plan view are joined to each other.

The other elements in this embodiment are almost the same as in the first embodiment, so the same elements as in the first embodiment are designated by the same reference signs and their description is not repeated.

The sixth embodiment brings about the same effects as the first embodiment.

Furthermore, in the sixth embodiment, the on-resistance can be reduced by increasing the plane occupied area of the reverse coupling protection element EL2 per unit area on the first surface FS.

Seventh Embodiment

Figure 33:
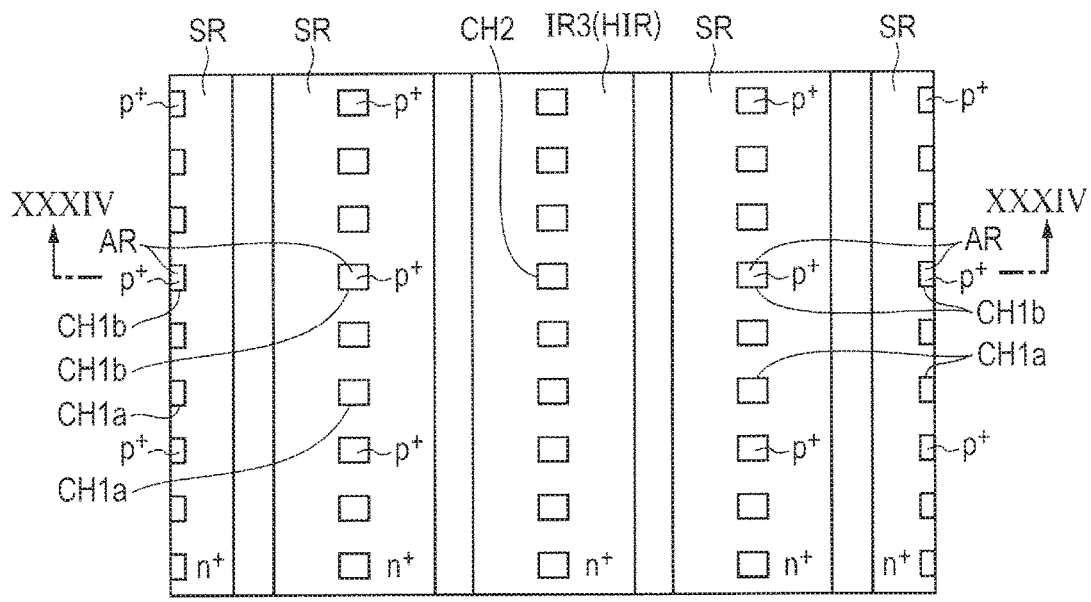
FIG. 33 is a plan view which shows the structure of a semiconductor device according to a seventh embodiment of the invention.
Figure 34:
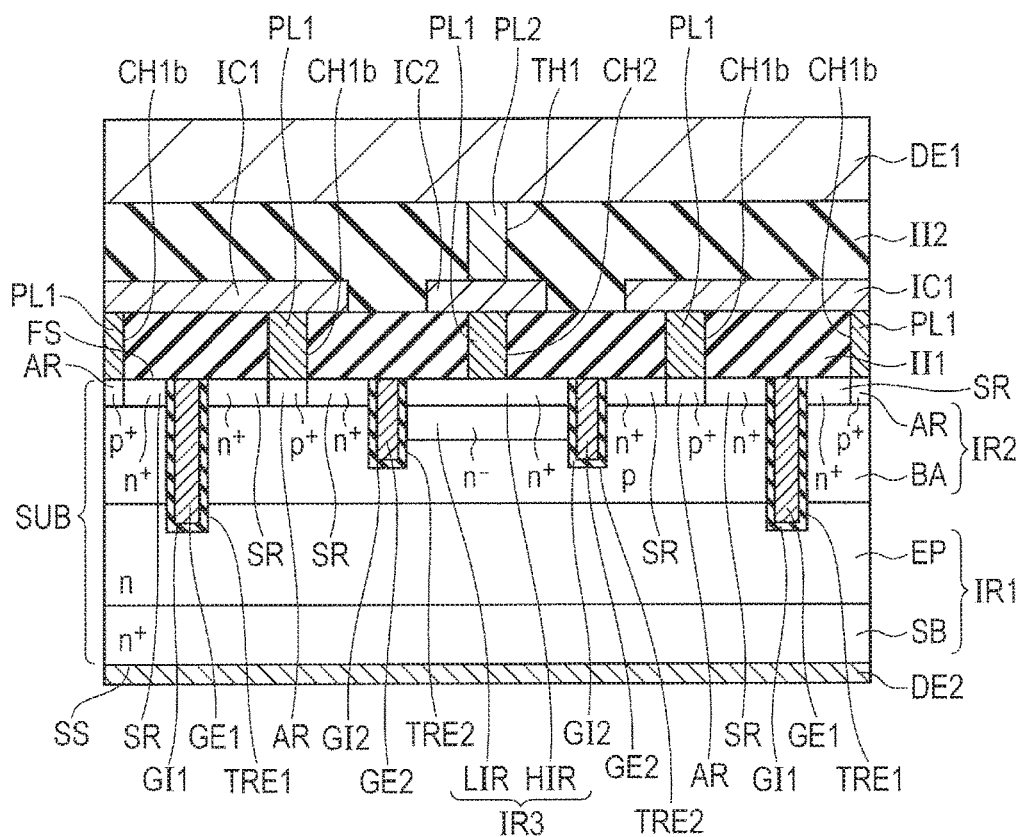
FIG. 34 is a schematic sectional view taken along the line XXXIV-XXXIV of FIG. 33.

As shown in FIGS. 33 and 34, in comparison with the first embodiment, the seventh embodiment is structurally different in the $n^+$ source region SR and $p^+$ back gate region AR. In plan view, the $p^+$ back gate region AR is surrounded by the $n^+$ source region SR in the first surface FS. Therefore, the $p^+$ back gate region AR is not in contact with the side face of the deep trench TRE1 nor the side face of the shallow trench TRE2. The $p^+$ back gate region AR is formed only just under the contact hole CH1$b$.

The other elements in this embodiment are almost the same as in the first embodiment, so the same elements as in the first embodiment are designated by the same reference signs and their description is not repeated.

In the manufacturing method according to the seventh embodiment, at the steps shown in FIGS. 18A and 18B, first an $n^+$ source region SR is formed in the whole first surface FS between the deep trench TRE1 and shallow trench TRE2. Then, p-type impurities with a sufficient concentration to turn the n-type impurity concentration of the $n^+$ source region SR into a p-type impurity concentration are implanted. The $p^+$ back gate region AR is formed by the implantation of p-type impurities.

The other steps of the manufacturing method according to the seventh embodiment are almost the same as those of the manufacturing method according to the first embodiment and their description is not repeated.

According to the seventh embodiment, both the $n^+$ source region SR of the energization control element EL1 and the $n^+$ source region SR of the reverse coupling protection element EL2 can be expanded. Consequently, the channel width of the nMOS transistor TR1 included in the energization control element EL1 and the channel width of the nMOS transistor TR2 included in the reverse coupling protection element EL2 can be increased.

The unit cell structure according to this embodiment may be used to make layouts for the first to sixth embodiments. The unit cell and trench layout to be used may be selected according to the required on-resistance value and withstand voltage of the energization control element EL1 and the required on-resistance and withstand voltage of the reverse coupling protection element EL2, which depend on the application purpose.

Eighth Embodiment

Figure 35:
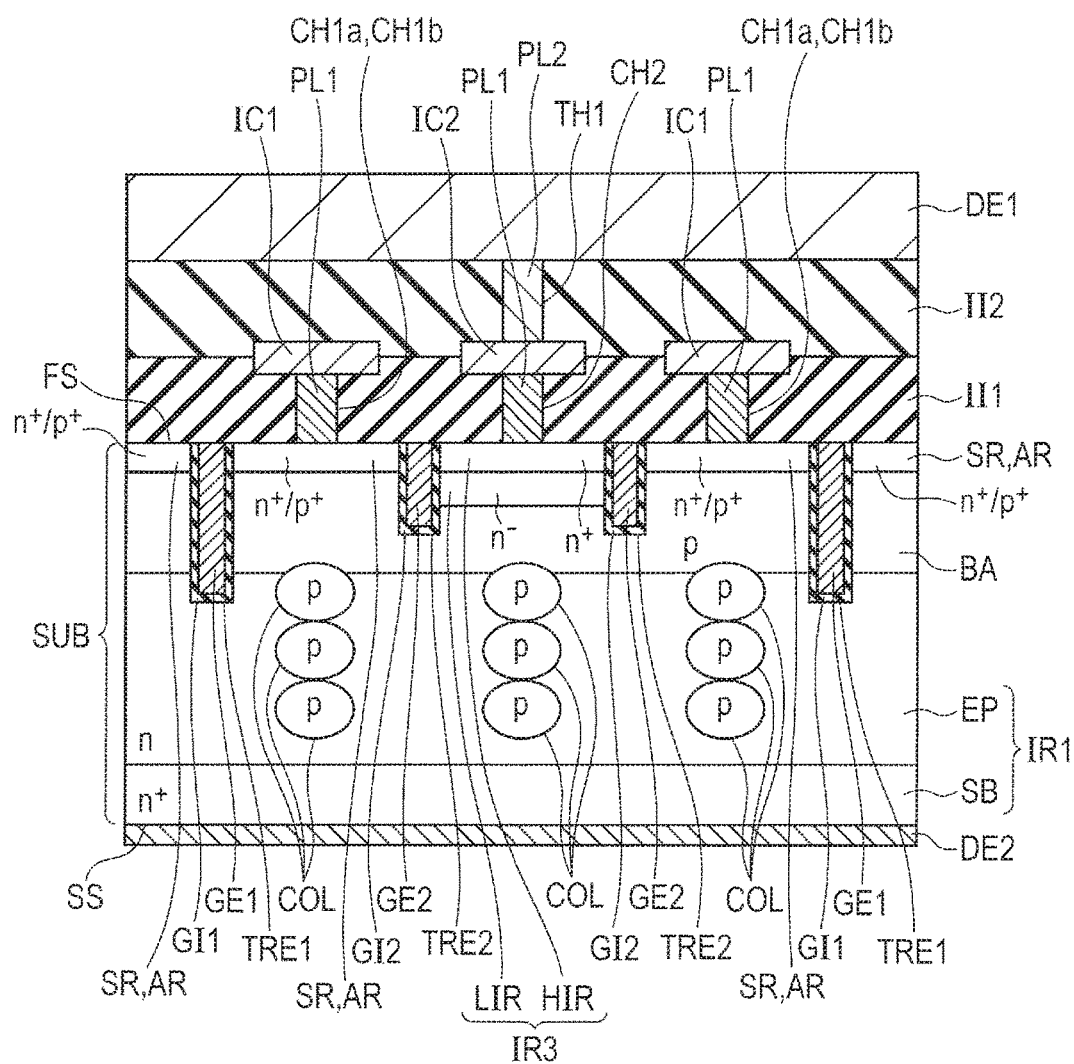
FIG. 35 is a schematic sectional view which shows the cross section of a semiconductor device according to an eighth embodiment of the invention which corresponds to the cross sections taken along the lines VII-VII and VIII-VIII of FIG. 6.

As shown in FIG. 35, the eighth embodiment is different from the first embodiment in that p-type column regions COL are added. A p-type column region COL is joined to the p-type impurity region IR2 and extends from the p-type impurity region IR2 into the n-type impurity region IR1 (n-type epitaxial region EP) to make a pn junction with the n-type impurity region IR1 (n-type epitaxial region EP).

The p-type column region COL may be located just under the n-type impurity region IR3. Or the p-type column region COL may be located just under the source region SR or back gate region AR.

The other elements in this embodiment are almost the same as in the first embodiment, so the same elements as in the first embodiment are designated by the same reference signs and their description is not repeated.

In the manufacturing method according to the eighth embodiment, after the p-type base region BA is formed as shown in FIG. 15, a photoresist pattern is formed over the first surface FS. Using the photoresist pattern as a mask, boron is implanted in an area nearer to the second surface SS than the p-type base region BA (area nearer to the second surface SS than the bottom face of the deep trench TRE1) by a high-energy implanting device. The p-type column region COL is formed by this boron implantation step. Boron implantation is performed several times with different implanting energy levels. Alternatively, boron implantation may be performed only once.

The other steps of the manufacturing method according to the eighth embodiment are almost the same as those of the manufacturing method according to the first embodiment and their description is not repeated.

Operation of the semiconductor device according to the eighth embodiment is the same as that according to the first embodiment.

If a low on-resistance is required, the resistance of the n-type epitaxial region EP must be decreased (the n-type impurity concentration of the n-type epitaxial region EP must be increased). Generally, when the n-type impurity concentration of the n-type epitaxial region EP is increased, the withstand voltage is decreased.

According to the eighth embodiment, boron ions with a relatively high concentration are implanted in a columnar pattern in a deeper region than the p-type base region BA in the first embodiment, so as to ensure charge balance. This makes it possible to produce a semiconductor device whose withstand voltage does not decline.

In the above first to eighth embodiments, regarding the conductivity type, n-type and p-type may be reversed. The features of the first to eighth embodiments may be combined as appropriate.

The invention made by the present inventors has been so far explained concretely in reference to the preferred embodiments thereof. However, the invention is not limited thereto and it is obvious that these details may be modified in various ways without departing from the gist thereof.

What is claimed is:

1. A semiconductor device having an energization control element including a first field effect transistor and a first diode and a reverse coupling protection element including a second field effect transistor and a second diode, the device comprising:
   a semiconductor substrate having a first surface and a second surface opposite to each other, a deep trench made in the first surface, and a shallow trench made in the first surface and shallower than the deep trench;
   a first region of a first conductivity type located in the second surface and in contact with a bottom face of the deep trench;
   a second region of a second conductivity type having a first portion located on a first surface side of the first region to make a pn junction with the first region and in contact with a bottom face of the shallow trench, and a second portion joined to the first portion and located in the first surface;
   a third region of the first conductivity type located in the first surface in a manner to make a pn junction with the second region and be in contact with a side face of the shallow trench;
   a fourth region of the first conductivity type located in the first surface in a manner to sandwich the shallow trench with the third region, make a pn junction with the second region, and be in contact with the side face of the deep trench and the side face of the shallow trench;
   a first gate electrode located in the deep trench in a manner to face the second region in an insulated manner, and included in the first field effect transistor; and
   a second gate electrode located in the shallow trench in a manner to face the second region in an insulated manner, and included in the second field effect transistor.

2. The semiconductor device according to claim 1, wherein the first region comprises a drain of the first field effect transistor, the third region comprises a drain of the second field effect transistor, and the fourth region comprises a source of the first field effect transistor and also a source of the second field effect transistor.

3. The semiconductor device according to claim 2, wherein the first region comprises a cathode of the first diode, the third region comprises a cathode of the second diode, and the second region comprises an anode of the first diode and also an anode of the second diode.

4. The semiconductor device according to claim 1, further comprising:
   a first wiring layer located over the first surface and electrically coupled to the second region and the fourth region; and
   a second wiring layer located over the first surface and electrically coupled to the third region.

5. The semiconductor device according to claim 1, further comprising an extension region of the first conductivity type being in contact with the shallow trench on the second surface side of the fourth region and having a lower impurity concentration than the fourth region.

6. The semiconductor device according to claim 1,
   wherein the deep trench has a first deep trench part and a second deep trench part,
   wherein the shallow trench has a first shallow trench part and a second shallow trench part,
   wherein the first deep trench part surrounds the first shallow trench part in the first surface and the second deep trench part surrounds the second shallow trench part in the first surface, and
   wherein the first deep trench part and the second deep trench part are separated from each other.

7. The semiconductor device according to claim 1,
   wherein the deep trench has a first deep trench part and a second deep trench part,
   wherein the shallow trench has a first shallow trench part and a second shallow trench part,
   wherein the first deep trench part surrounds the first shallow trench part in the first surface and the second deep trench part surrounds the second shallow trench part in the first surface, and
   wherein the first deep trench part and the second deep trench part are joined to each other.

8. The semiconductor device according to claim 1,
   wherein the deep trench has a first deep trench part, a second deep trench part located in a first direction of the first deep trench part in the first surface, and a third deep trench part located in a second direction perpendicular to the first direction of the first deep trench part in the first surface, wherein the shallow trench has a first shallow trench part, a second shallow trench part, and a third shallow trench part, wherein the first deep trench part surrounds the first shallow trench part in the first surface, the second deep trench part surrounds the second shallow trench part in the first surface, and the third deep trench part surrounds the third shallow trench part in the first surface, and wherein the first deep trench part and the second deep trench part are separated from each other and the first deep trench part and the third deep trench part are joined to each other.

9. The semiconductor device according to claim 1,
wherein the deep trench has a first deep trench part, a second deep trench part located in a first direction of the first deep trench part in the first surface, and a third deep trench part located in a second direction perpendicular to the first direction of the first deep trench part in the first surface, wherein the shallow trench has a first shallow trench part, a second shallow trench part, and a third shallow trench part, wherein the first deep trench part surrounds the first shallow trench part in the first surface, the second deep trench part surrounds the second shallow trench part in the first surface, and the third deep trench part surrounds the third shallow trench part in the first surface, and wherein the first deep trench part and the second deep trench part are separated from each other and the first deep trench part and the third deep trench part are separated from each other.

10. The semiconductor device according to claim 1,
wherein the deep trench has a first deep trench part, a second deep trench part located in a first direction of the first deep trench part in the first surface, and a third deep trench part located in a second direction perpendicular to the first direction of the first deep trench part in the first surface, wherein the shallow trench has a first shallow trench part, a second shallow trench part, and a third shallow trench part, wherein the first deep trench part surrounds the first shallow trench part in the first surface, the second deep trench part surrounds the second shallow trench part in the first surface, and the third deep trench part surrounds the third shallow trench part in the first surface, and wherein the first deep trench part and the second deep trench part are joined to each other and the first deep trench part and the third deep trench part are joined to each other.

11. The semiconductor device according to claim 1,
wherein the second region is in contact with both the deep trench and the shallow trench in the first surface, and
wherein the pn junction of the second region and the fourth region extends from the deep trench to the shallow trench in the first surface.

12. The semiconductor device according to claim 1, wherein the second region is surrounded by the fourth region in the first surface.

13. The semiconductor device according to claim 1, further comprising a column region of the second conductivity type joined to the second region and extending from the second region into the first region to make a pn junction with the first region.

14. The semiconductor device according to claim 13, wherein the column region is located just under the third region.

15. The semiconductor device according to claim 13, wherein the column region is located just under the fourth region.

16. A method for manufacturing a semiconductor device having an energization control element including a first field effect transistor and a first diode and a reverse coupling protection element including a second field effect transistor and a second diode, the method comprising the steps of:

providing a semiconductor substrate having a first surface and a second surface opposite to each other;

forming a first region of first conductivity type located in the second surface;

forming a deep trench and a shallow trench shallower than the deep trench ih the first surface;

forming a first gate electrode included in the first field effect transistor in a manner to be located in the deep trench and forming a second gate electrode included in the second field effect transistor in a manner to be located in the shallow trench;

forming a second region of second conductivity type having a first portion located nearer to the first surface than a bottom face of the deep trench to make a pn junction with the first region and in contact with a bottom face of the shallow trench and a side face of the deep trench, and a second portion joined to the first portion and located in the first surface;

forming a third region of the first conductivity type in the first surface in a manner to make a pn junction with the second region and be in contact with a side face of the shallow trench; and forming a fourth region of the first conductivity type in the first surface in a manner to sandwich the shallow trench with the third region, make a pn junction with the second region, and be in contact with the side face of the deep trench and the side face of the shallow trench.

* * * * *